US006828771B1

(12) United States Patent
Ghassemi

(10) Patent No.: US 6,828,771 B1
(45) Date of Patent: Dec. 7, 2004

(54) ELECTRICAL POWER MEASUREMENT

(75) Inventor: Foroozan Ghassemi, London (GB)

(73) Assignee: Electric Power Research Limited, Belfast (GB)

( * ) Notice: Subject to any disclaimer, the term of this patent is extended or adjusted under 35 U.S.C. 154(b) by 0 days.

(21) Appl. No.: 09/508,136
(22) PCT Filed: Jul. 8, 1999
(86) PCT No.: PCT/GB99/02189
§ 371 (c)(1),
(2), (4) Date: Jun. 5, 2000
(87) PCT Pub. No.: WO00/03262
PCT Pub. Date: Jan. 20, 2000

(30) Foreign Application Priority Data

Jul. 8, 1998 (GB) .............................................. 9814793

(51) Int. Cl.[7] ........................ G01R 11/32; G01R 23/16; G01R 21/06
(52) U.S. Cl. .................... 324/142; 324/141; 324/76.12; 702/61
(58) Field of Search ................................ 324/141–142, 324/103 R, 76.12, 86, 620–626, 140 R, 140 D, 108; 702/60, 64, 68, 69, 76, 77, 198–199

(56) References Cited

U.S. PATENT DOCUMENTS

| 3,697,872 A | * | 10/1972 | Schulz ......................... 324/142 |
| 4,672,555 A | | 6/1987 | Hart et al. |
| 4,937,520 A | * | 6/1990 | Arseneau et al. ......... 324/77.11 |
| 5,072,187 A | * | 12/1991 | Shilo ........................... 324/623 |
| 5,144,226 A | * | 9/1992 | Rapp ........................... 324/132 |
| 5,212,441 A | * | 5/1993 | McEachern et al. ......... 324/142 |
| 5,508,617 A | * | 4/1996 | Komatsu ..................... 324/379 |
| 5,673,196 A | * | 9/1997 | Hoffman et al. .............. 702/65 |
| 6,672,555 B2 | | 1/2004 | Chang |

FOREIGN PATENT DOCUMENTS

EP 0 660 120 A 6/1995

OTHER PUBLICATIONS

L.S. Czarnecki, "Orthogonal Decomposition of the Currents in a 3–phase Non–Linear Asymmetrical Circuit with Non–sinusoidal Voltage Source," IEEE Trans. Instrumentation and Measurement vol. 37, Mar. 988 pp. 30–34.
L.S. Czarnecki, "What is wrong with the Budeanu Concept of Reactive and Disortion Power and why it should be Abandoned," IEEE Trans. Instrumentation and Measurement vol. IM–36, Sep. 1987, pp. 834–837.

(List continued on next page.)

Primary Examiner—Anjan K. Deb
(74) Attorney, Agent, or Firm—Stevens & Showalter LLP

(57) ABSTRACT

An electric power meter measures the value of an electrical power parameter, e.g., Universal Apparent Power or Universal Power Factor, of an electrical power signal in the time domain by: calculating a first instantaneous power component as the product of an instantaneous voltage signal and an instantaneous current signal of the electrical power signal, carrying out a relative phase shift between the instantaneous voltage signal and the instantaneous current signal; and calculating a second instantaneous power component as the product of the relatively phase-shifted instantaneous voltage and instantaneous current signals. The first and second instantaneous power components are then RMS averaged to determine their respective magnitudes. Both of the calculated magnitudes are then used to determine the value of the electrical power parameter. The method can alternatively be implemented in the frequency domain to produce equivalent measurement values.

51 Claims, 10 Drawing Sheets

OTHER PUBLICATIONS

P.S. Filipski, "Polyphase Apparent Power and Power Factor Under Distorted Waveform Conditions," IEEE Trans. on Power Delivery, vol. 5, PWDR–6, No. 3, pp. 1161–1165, Jul., 1991.

L.S. Czarnecki, "Power Related Phenomena in Three–Phase Unbalanced Systems," IEEE Trans. on Power Devlivery, vol. 10, No. 3, pp. 1168–1176, Jul. 1995.

A. Emanuel, "On the Definition of Power Factor and Apparent Power in Unbalanced Polyphase Circuits with Sinusoidal Voltage and Currents," IEEE Trans. on Power Delivery, vol. 8, No. 3, pp. 841–852, Jul. 1993.

IEEE Working Group Report, "Practical Definitions for Powers in Systems with Non–Sinusoidal Waveforms and Unbalanced Loads: A Discussion," IEEE Trans. on Power Delivery, vol. 11, No. 1, pp. 79–101, Jan. 1996.

P.S. Filipski, "Apparent Power—A Misleading Quantity in the Non–Sinusoidal Power Theory: Are all Non–Sinusoidal Power Theories Doomed to Fail?," ETEP. vol. 3, No. 1, pp. 21–26, Jan./Feb. 1993.

A.E. Emanuel, "Powers in Non–Sinusoidal Situations. A Review of Definitions and Physical Meaning," IEEE Transs. on Power Delivery, vol. 5, No. 3, pp. 1377–1389, Jul. 1990.

Salvatore L et al, "Time–frequency Representations of Instantaneous Complex Power, Voltage and Current Space Vectors," European Transactions on Electrical Power Engineering, vol. 4, No. 5, pp. 395–401, Sep., 1994.

L.S. Czarnecki et al, "Powers in Nonsinusoidal Networks: Their Interpretation, Analysis, and Meaurement", IEEE Transactions on Instrumentation and Measurement, vol. 39, No. 2, pp. 340–345, Apr., 1990.

* cited by examiner

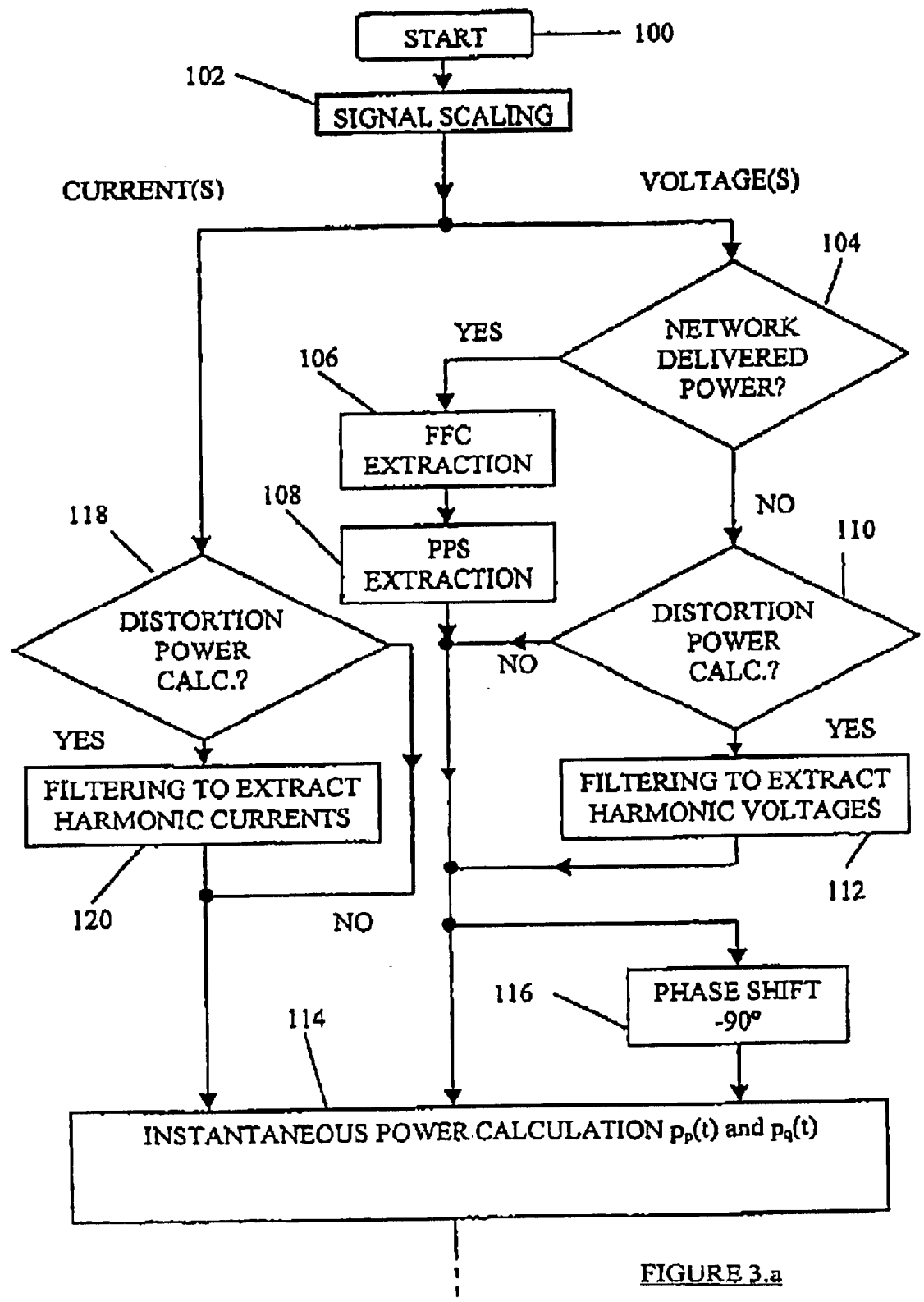
FIGURE 3.a

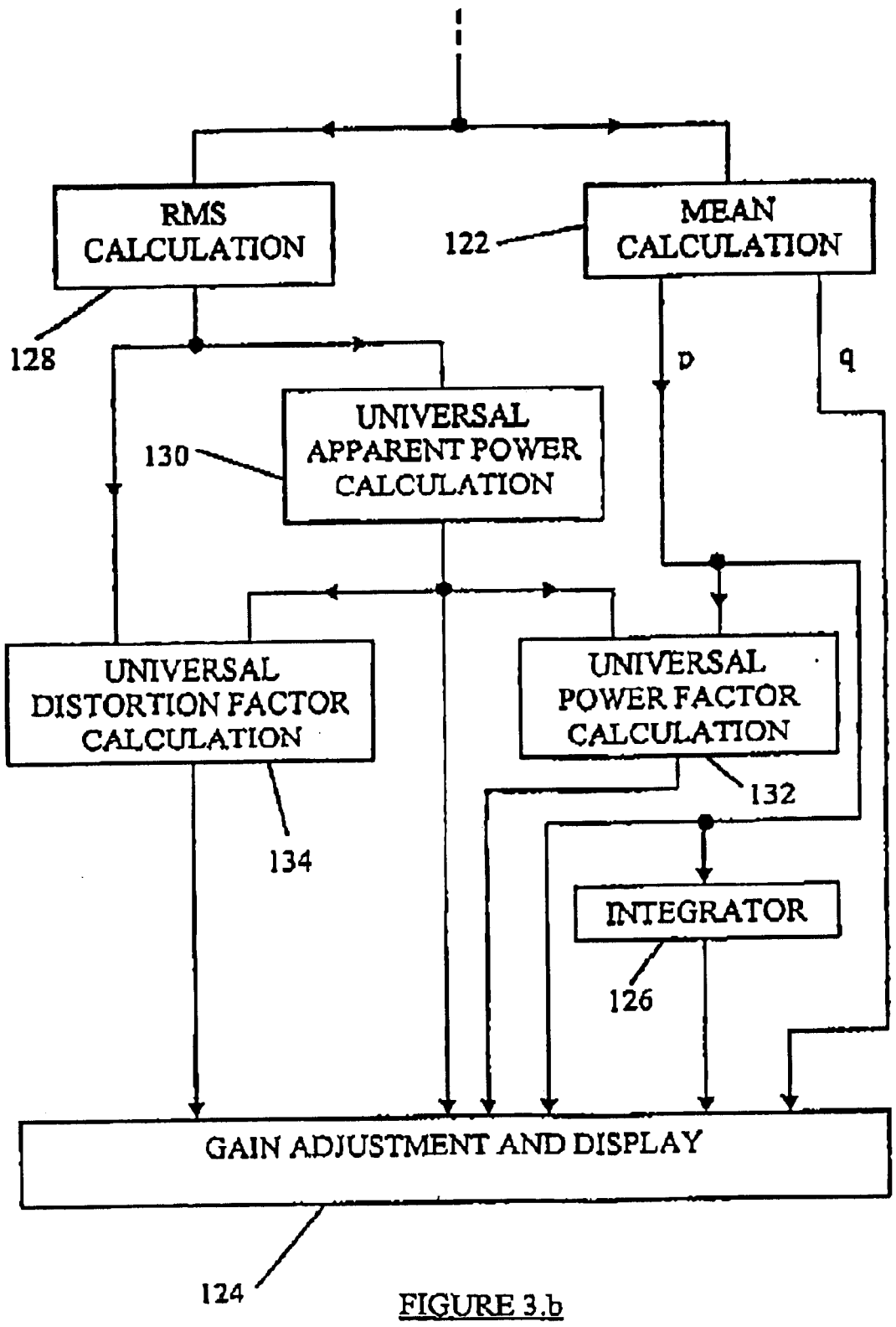
FIGURE 3.b

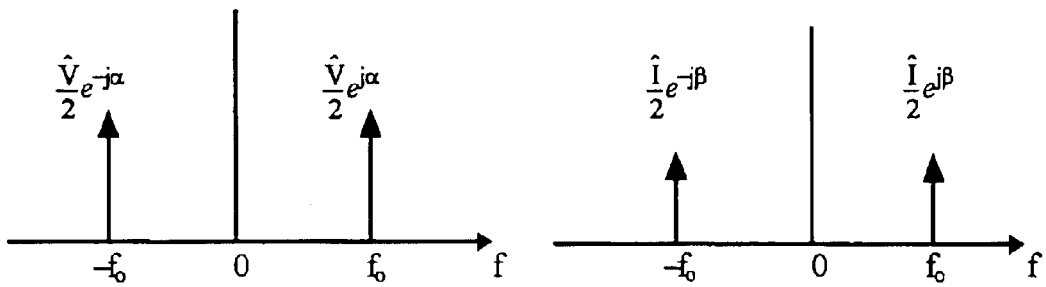
Figure 7.a   Figure 7.b
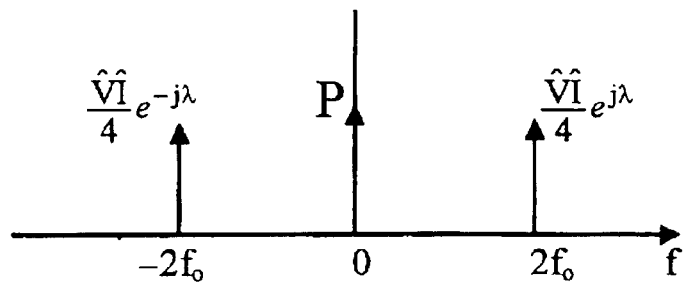
Figure 8
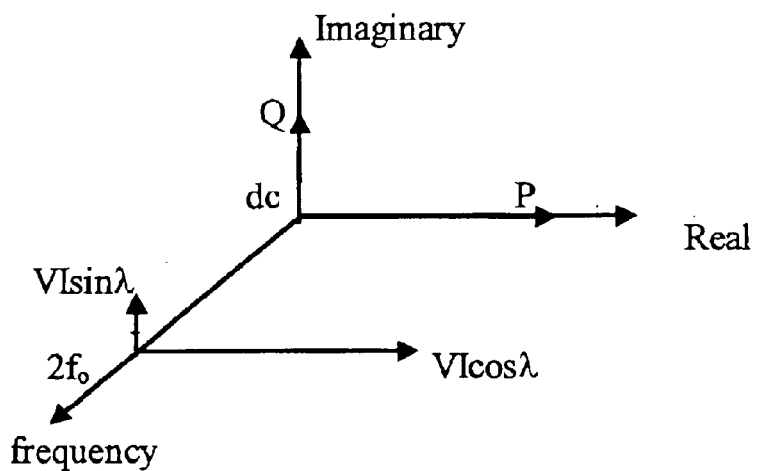
Figure 9

ELECTRICAL POWER MEASUREMENT

BACKGROUND OF THE INVENTION

The present invention concerns improvements relating to electrical power measurement and more particularly, though not exclusively, to a method of measuring an electrical power parameter, such as Apparent Power or Power Factor, which is accurate for single and multiple phases under all conditions namely those of balanced and unbalanced loads, and distorted and non-distorted waveforms.

The quantities that have conventionally been used to measure the quality and quantity of electric power are generally considered to be true and accurate when power is supplied to the load in a sinusoidal waveform and the load bears equally on each phase of the supply. The parameters that are widely used in power measurement are Active Power (P), Apparent Power (S), Reactive Power (Q) and Power Factor (PF).

Active power, when integrated in time, is used for billing purposes and reflects the energy consumed. Power Factor in AC circuits is a convenient figure of merit representing the utilisation of the supplying system by consumers and is used to determine the quality of the load. Reactive Power contributes to transmission losses and is used to define the oscillation of energy caused by reactive elements in the load. It is an important quantity in defining the current carrying capacity of electrical transmission systems, in the design of consumer plants and equipment and is often used in the calculation of Power Factor. Apparent Power is used to measure the maximum demand for industrial loads and it reflects the capital investment in the supplying systems. Apparent Power is also used in power engineering to define the maximum ratings of electrical apparatus, and in revenue metering, it is used as a meaningful quantity in the general power theory of electrical networks.

Of the above-mentioned quantities only the first, Active Power, is widely accepted as holding for unbalanced or non-sinusoidal situations. Reactive Power, Apparent Power and Power Factor become less valid when the supply is distorted or the load is unbalanced.

Non-linear and unbalanced loads are widespread and have caused concerns to electricity suppliers, users and regulators for many years. Non-linear loads have detrimental effects on components of the power system, they give rise to harmonic power flows to other users of the supply, and they contribute to a deterioration of the supply quality. Also, load imbalance in polyphase systems reduces the performance of the distribution system, causes voltage asymmetries which may be harmful for customers' loads, and also contributes to a deterioration of the supply quality. In the absence of a proper system for power measurement for non-linear loads, various approximations and work-arounds are made. These are unsatisfactory from many points of view: consumers are not charged accurately, and equipment designers have to cope with a margin of error when their prototypes are tested, for example.

The lack of a universally accepted definition of Apparent Power, for example, leads to inconsistencies and inaccuracies in VA demand meters used for billing purposes. Meters from different manufacturers (or even different models by the same manufacturer) use different definitions of Apparent Power. Different operating principles may also be used. Each meter type therefore responds differently to different types of load, and no conventional meter gives consistent results for all loads. Under distorted waveform conditions their readings can differ by several percent even for the same balanced but non-linear, load. In extreme circumstances, the differences may be as high as 30%. Standard engineering text books tend to skate over this problem, but International institutions such as the EEC, IEEE and IEE are well aware of it.

Due to uncertainties in defining Reactive Power in non-sinusoidal situations, the use of Apparent Power is preferred in some countries for determining Power Factor. However, using existing standard power theory in AC circuits, Apparent Power itself cannot be defined consistently in an unbalanced three-phase system.

There is a considerable body of literature which describes the shortcomings of the current approach to calculating Apparent Power, Reactive Power, and Power Factor. Examples notable for their clarity are:

(1) A. Emanuel, "On the Definition of Power Factor and Apparent Power in Unbalanced Polyphase Circuits with Sinusoidal Voltage and Currents,", IEEE Trans. On Power Delivery, Vol. 8, No. 3, pp. 841–852, July 1993;

(2) P. S. Filipski, Polyphase "Apparent Power—the Misleading Quantity In Non-Sinusoidal Power Theory: Are all Non-Sinusoidal Power Theories Doomed to Fail?," ETEP, Vol.3, No.1, pp. 21–26, January/February 1993; and (3) R. West, "The Measurement of Apparent and Reactive Power with Unbalanced Loads and Non-Sinusoidal Waveforms", Distribution 2000 Conference, Sydney, 1997.

These authors described three key aspects of the problem Firstly, that there appears to be a good working definition in single-phase systems, where convention gives rise to calculated quantities to which one can attribute a physical meaning. Secondly, that there is a problem in polyphase systems of attributing a real physical meaning to the calculated parameters in existing theories. Intuitive reasoning appears to fail here. Thirdly, that the analysis of polyphase systems gives rise to no less than five different definitions for Apparent Power in three-phase systems with or without distorted waveforms. These results are often different by quite significant margins; particularly in unbalanced systems with distortion.

A good review of previous works has been presented in the paper by West (1997). The problems have been reported in many technical papers in for example by West (1997), Filipski (1993), Emanuel (1993), and in IEEE Working Group Report, "Practical Definitions for a Powers in Systems with Non-Sinusoidal Waveforms and Unbalanced Loads: A Discussion", IEEE PWRD, Vol. 11, pp. 79–101., but yet no acceptable solutions have been found. The emphasis for calculating Apparent Power is now on System (equivalent) Apparent Power, see the papers by West (1997), Emanuel (1993), and IEEE Working Group Report. Also, the quantity know as RMS Apparent Power has also been considered by some technical institutions.

One of the main disadvantages with all the proposed methods for calculating Apparent Power is the fact that their results all depend on the voltage of reference point at which measurement is made. In single-phase circuits, the RMS values of voltage across the load and current through the load are clearly defined. However, in three-phase systems the Apparent Power should not depend on the reference voltage see paper by L. S. Czarnecki, "Power Related Phenomena in Three-Phase Unbalanced Systems", IEEE PWRD, Vol. 10, pp. 1168–1176. This disadvantage of the conventional power measurement methods is readily apparent by the following example of a three-phase system.

Considering FIG. 1, in a balanced situation, points $0$, $N_1$ and $N_2$ have zero voltage. The RMS values of the phase voltages measured with respect to three references are the same which in turn it implies that the Apparent Powers are equal. However, if the load is unbalanced then $N_1$, $N_2$ and $0$ have different voltages. Only $0$ retains zero voltage. Thus, Apparent Power calculated using the voltages measured with respect to $0$, $N_1$, and $N_2$ will be different.

Now consider a three-phase load that is supplied by an ideal source ($Z_s=0$). Assume that one of the lines, say "c", is broken ($I_c=0$). The measured voltage for phase "c" would be different on the sides of the broken point. If the voltage transducer is on the source side then it is the source voltage and if the potential transformer is on the load side, the measured voltage is influenced by the current of other two lines and the load impedance. Thus, the system (equivalent) Apparent Power (see papers by West (1997) and IEEE Working Group Report) will be different for the load.

One of the reasons for calculating Apparent Power is to obtain Power Factor. Consider now a single-phase circuit consisting of source with impedance $Z_s$ and a pure resistive load. Conventionally, Power Factor for this load is calculated to be unity. Assume that the above single-phase load is connected to a three-phase system with the same source impedance/phase as the single-phase system. For simplification of the analysis assume a perfect earthing, hence zero neutral impedance. Depending on the definition used different results are obtained for Power Factor as the calculated Apparent Powers are different. Phasor and RMS Apparent Powers are both equal to unity. The System Apparent Power would be less than one. Surely, as the full system capacity is not utilised by the load and also due to extra losses in the form of negative and zero sequence powers in the source impedance, a unity Power Factor is technically unacceptable. In other words, a unity Power Factor does not reflect the quality of the load and utilisation of the system (see papers by L. S. Czarnecki and Emanuel). The System Apparent Power does reflect this effect of a single-phase load connected to a three-phase supply. However, since the load itself, and thus its quality, has not changed then one may argue that Power Factor must remain the same. It is clearly seen by the above that there is an inconsistency in the approach, observation and result using conventional power theory in AC circuits.

It is an object of the present invention to overcome the above problems.

SUMMARY OF THE INVENTION

The inventor has determined that the cause of the problems observed for polyphase circuits lies in the basic characterisation applied to single-phase circuits, which is flawed. Though the results given for single-phase systems are acceptable in practice, the extension to polyphase systems strains the analysed and produces the difficulties such as misleading and inconsistent results which have been observed.

The inventor has developed a novel power measurement method based on a new approach which advantageously removes the uncertainty and ambiguity from present methods of power measurement. The new approach applies consistently across-the-board to balanced and unbalanced loads, linear and non-linear loads, single-phase and polyphase supplies, to sinusoidal and non-sinusoidal supplies, and which is consistent for all system topologies and conditions, does not violate any principle of electrical engineering and can be readily implemented in practical equipment. The basis for the present invention is a complete and self-consistent mathematical approach covering all measurement scenarios.

According to one aspect of the present invention, there is provided a method of measuring the value of an electrical power parameter, such as Apparent Power or Power Factor, of an electrical power signal the method comprising: calculating a first instantaneous power component as the product of an instantaneous voltage signal of the electrical power signal and an instantaneous current signal of the electrical power signal; carrying out a relative phase shift between the instantaneous voltage signal and the instantaneous current signal; calculating a second instantaneous power component as the product of the relatively phase-shifted instantaneous voltage and instantaneous current signals; RMS averaging each of the first and second power components to determine their respective magnitudes; and using both of the calculated magnitudes to determine the value of the electrical power parameter.

One of the advantages of the present invention is that it enables consistent measurement such that loads can be properly characterised, so that efficient engineering action can be taken, or accurate pricing adjustments can be made.

A utility embodying the present invention can offer accurate metering of these awkward loads can offer keener prices to attract the business of those customers whose loads are over-estimated by existing meters. It has a proper basis on which to raise its prices to customers whose loads have been underestimated, to reflect the true economics of supplying them. There are many other commercial benefits.

The new approach described herein redefines the nature of Reactive Power. On that basis, a new definition for Apparent Power is provided which is consistent for all circuit situations and topologies. The new definitions satisfy the rules of electrical engineering both in time and frequency domain.

In an embodiment of the present invention, a voltage signal is phase shifted by $-90$ to produce a quadrature axis voltage signal. By multiplying the original and quadrature voltages by a current signal, two instantaneous power signals are obtained. The former is an instantaneous active power component signal $p_p(t)$ and the latter is an instantaneous quadrature (reactive) power component signal $p_q(t)$. These signals satisfy the law of conservation of energy throughout the circuit, which implies that the sum of each of these instantaneous powers of different points in the circuit is zero. Reactive Power is then defined as the average DC-component value (mean) of the quadrature (instantaneous) power, $p_q(t)$, that was obtained from the product of the quadrature axis voltage and current signal. Note that in conventional power theory, although Reactive Power is defined as the peak of the non-energy related component of instantaneous power, it is typically measured and considered as an average DC-component (mean) of the instantaneous power in technical applications such as billing.

According to the present invention, when the power parameter to be measured is Apparent Power, it is defined as the RMS value of the complex instantaneous power given by Equation (1).

$$p(t)=p_p(t)+ip_q(t) \qquad (1)$$

where $p_p(t)$ is an instantaneous active power component $p_q(t)$ is an instantaneous reactive power component This definition of Apparent Power provides a consistent result in all system conditions, from single-phase sinusoidal to unbalanced three-phase systems with distorted waveforms. This consistency is unobtainable in other approaches.

In balanced three-phase systems with pure sinusoidal waveforms, the results obtained using the new approach are the same as those using conventional power theory.

In three-phase systems, since the new power theory is based on the sum of the instantaneous powers of three phases, then the measured Apparent Power, for example, is independent of the reference point voltage that is used in voltage measurement. This feature overcomes the conventional measurement methods problems described previously with respect to FIG. 1 and is unique when comprising with other definitions of Apparent Power cited in literature and standards.

Using conventional understanding, Reactive Power is defined as the peak value of one of the oscillatory components of the instantaneous power. The inventor has determined that that this cannot be obtained in frequency domain contrary to Plancherel's Theorem. This discrepancy between frequency and time domain results leads to indeterminable quantities in the time and frequency domains, and is attributable to the fact that present power theory does not provide any information about Reactive Power in the frequency domain. Reactive Power as defined by the new approach is determined in both the time and frequency domains as an imaginary DC value, and the method is consistent for all system topologies.

The average (mean) values of the new instantaneous power on the real and the imaginary axes correspond to Active and Reactive Power respectively. Thus, in a method embodying the present invention, Reactive Power is defined and measured as a DC value and not as an ambiguous peak of one of the oscillatory components of instantaneous power.

Using the method embodying the present invention to determine the Active and Reactive Powers, it is demonstrated later that standard circuit theories are satisfied. The treatment of single-phase and three-phase systems are the same except that in three-phase systems the analysis is carried out on a per phase basis, and the total instantaneous power is obtained by adding together the three-phase results.

The 2-Norm, or RMS, of a signal is a measure of the size of that signal. Thus, Universal Apparent Power as determined by the method embodying the present invention is defined as the RMS of the complex instantaneous power. In three-phase balanced systems this definition leads to the standard definition of Universal Apparent Power that is three times the product of RMS of voltage and RMS of current.

However, using the method embodying the present invention in single-phase and unbalanced three-phase systems, the Universal Apparent Power is different from conventional Apparent Power, although it retains its basic dimension of volt-ampere. In fact, from the new approach it can be seen that in single-phase- systems the Universal Apparent Power is $\sqrt{2}$ times the RMS of voltage and current. This departure from the conventional Power Factor (which itself has little basis other than convention) is due to the AC components of the instantaneous power. In balanced three-phase systems the AC terms of the instantaneous power are cancelled.

Universal Power Factor determined by the method embodying the present invention is then considered as the ratio of Active Power to Universal Apparent Power as compared to conventional Power Factor. This leads to a reduced value for Universal Power Factor in a pure resistive single-phase circuit. In fact, for such a system the Universal Power Factor cannot be greater than 0.707 ($1/\sqrt{2}$). This reflects the consistency in the approach. This result, though arithmetically inconvenient, is shown to have a real basis in the analysis.

Symmetrical components have been used to analyses the new parameter definitions which are a feature of the present invention and a decomposition of different parameters in terms of the sequence components has been obtained. It is more technically acceptable for metering purposes that only the positive phase sequence voltage is considered in the analysis. This reflects the effects of unbalanced loads on the systems.

Preferably, the method further comprises filtering at least one of the instantaneous voltage and instantaneous current signals of the electrical power signal prior to their use in the calculating steps. In this way, several different but related parameters can be calculated by the same method steps with the appropriately filtered signals. More particularly, the filtering step preferably results in the fundamental frequency of the instantaneous voltage or the instantaneous current being obtained. Fundamental frequency filtered voltage signals enable the measured power parameter to be representative of network delivered power namely the power taken (used) by the load from the power supply.

It is to be appreciated that the present invention utilises at least the harmonics of one of the instantaneous voltage or the instantaneous current in combination with at least the fundamental frequency of the other instantaneous current or instantaneous voltage, to determine the power parameter. This covers three different situations namely: when one of the instantaneous voltage or current signals is unfiltered providing its full spectrum and the other is filtered; when both signals are unfiltered each providing the full frequency spectrum; and when one of the instantaneous voltage or current signals is filtered to provide its fundamental frequency spectrum and the other is filtered to provide its harmonic frequency spectrum. There is information in the harmonics of the instantaneous voltage or the instantaneous current which has previously been discarded that provides a more accurate measure of the power parameter.

By utilising the appropriate combination of filtered/unfiltered signals the following power parameters can be advantageously be calculated: Universal Apparent Power, Harmonic Apparent Power, Universal Distortion Factor, Voltage Distortion Power, Current Distortion Power, and Universal Power Factor.

The method may further comprise comparing a Network Delivered Power (NDP) Parameter, the Harmonic Apparent Power Parameter, the Voltage Distortion Power Parameter, or the Current Distortion Power Parameter with another power parameter determined by the method to produce a dimensionless figure of merit representative of the waveform distortion produced, in the electrical power signal by a load to which the electrical power signal is supplied. This is a particularly useful power parameter to measure as it provides information about where power supply distortion is being generated. For example, power parameters such as Voltage Distortion Factor and Current Distortion Factor can be determined.

When the electrical power signal comprises a balanced or unbalanced multiple-phase signal, the method preferably further comprises resolving the multiple-phase signal into a phase sequence for use in establishing the effect of the load on the electric power network. The phase sequence may comprise a positive-phase sequence in order to obtain a measure representative of the power generated at a source of the electrical power signal. Alternatively, the phase sequence may comprise negative and zero-phase sequences in order to obtain a measure representative of the power converted in the load. The method may also comprise using the positive, the negative and the zero-phase sequences to obtain a measure representative of the power used by the load.

The present invention also extends to a method of measuring a power parameter such as Apparent Power or Power Factor, of an electrical power signal the method comprising converting measured instantaneous voltage and current signals of the electrical power signal into the frequency domain and carrying out frequency spectrum analysis on the signals to derive the power parameter.

The method preferably further comprises: carrying out a relative phase-shift between the instantaneous voltage signal and the instantaneous current signal; and converting the relatively phase-shifted instantaneous voltage and current signals into the frequency domain for use in the frequency spectrum analysis.

Alternatively, the method further comprises: carrying out a relative phase-shift between the instantaneous voltage signal and the instantaneous current signal in the frequency domain for use in the frequency spectrum analysis.

The phase shift is important in order to be able to measure the imaginary (quadrature) component of the instantaneous power. In this way, the measurement of power quantities can be digitised and hence made significantly cheaper and more robust. The use of the frequency domain to calculate the power parameters also advantageously reduces the component counts in meters implementing the method.

Preferably, the frequency spectrum analysis involves carrying out a first convolution of the frequency spectra associated with the instantaneous voltage and current signals, a second convolution of the frequency spectra associated with the phase-shifted instantaneous voltage and current signals, and combining the results of the first and second convolutions.

According to another aspect of the present invention there is provided a method of measuring the value of an electrical power parameter, such as Apparent Power or Power Factor, of an electrical power signal the method comprising: converting an instantaneous voltage signal of the electrical power signal and an instantaneous current signal of the electrical power signal from the time domain into the frequency domain as frequency spectra; calculating a first instantaneous power spectrum as the convolution of the frequency spectra of the instantaneous voltage signal and the instantaneous current signal; carrying out a relative phase shift between the instantaneous voltage signal and the instantaneous current signal in the time domain; calculating a second instantaneous power spectrum as the convolution of the frequency spectra of the relatively phase-shifted instantaneous voltage and current signals; combining each of the first and second power spectra to determine the value of the electrical power parameter.

According to another aspect of the present invention, there is provided a method of measuring an electrical power parameter such as Apparent Power or Power Factor, of an electrical power signal, the method comprising: filtering at least one of an instantaneous voltage signal or an instantaneous current signal of the electrical power signal; using the filtered instantaneous voltage and current signal in: calculating first and second instantaneous power components as the respective products of non phase-shied/phase-shifted, instantaneous voltage and instantaneous current signals; RMS averaging each of the first and second instantaneous power components to determine their respective magnitudes; and using the calculated magnitudes to determine the value of the electrical power parameter.

In another aspect, the present invention provides a method of measuring a power quantity such as Apparent Power or Power Factor, of a multiple-phase electrical power signal, the method comprising: resolving the multiple-phase signal into a phase sequence for use in establishing the effect on the electrical power signal of a load to which the electrical power signal is supplied; using the phase sequence in: calculating first and second instantaneous power components as the respective products of non phase-shifted/phase-shifted, instantaneous voltage and instantaneous current signals; and RMS averaging each of the first and second power components to determine their respective magnitudes; and using the calculated magnitudes to determine the value of the electrical power parameter.

The present invention extends to an electrical power meter for measuring the value of an electrical power parameter, such as Apparent Power or Power Factor, of an electrical power signal, the meter comprising: means for calculating a first instantaneous power component as the product of an instantaneous voltage signal of the electrical power signal and an instantaneous current signal of the electrical power signal; means for implementing a relative phase shift between the instantaneous voltage signal and the instantaneous current signal; means for calculating a second instantaneous power component as the product of the relatively phase-shifted instantaneous voltage and instantaneous current signals; mean for RMS averaging each of the first and second power components to determine their respective magnitudes; and means for using the calculated magnitudes to determine the value of the electrical power parameter.

BRIEF DESCRIPTION OF THE DRAWING

Presently preferred embodiments of the present invention will now be described by way of example with reference to the accompanying drawings. In the drawings:

FIG. 3 is a flow diagram showing the steps involved in the implementation of the method of the first embodiment of the present invention;

FIG. 8 is a diagrammatic representation of the frequency spectrum of an active component ($P_p(f)$) of the instantaneous power of the single-phase AC power circuit;

FIG. 9 is a phasor diagram of the frequency spectrum of the complex instantaneous power of the single-phase AC power circuit;

DETAILED DESCRIPTION OF THE INVENTION

Figure 1:
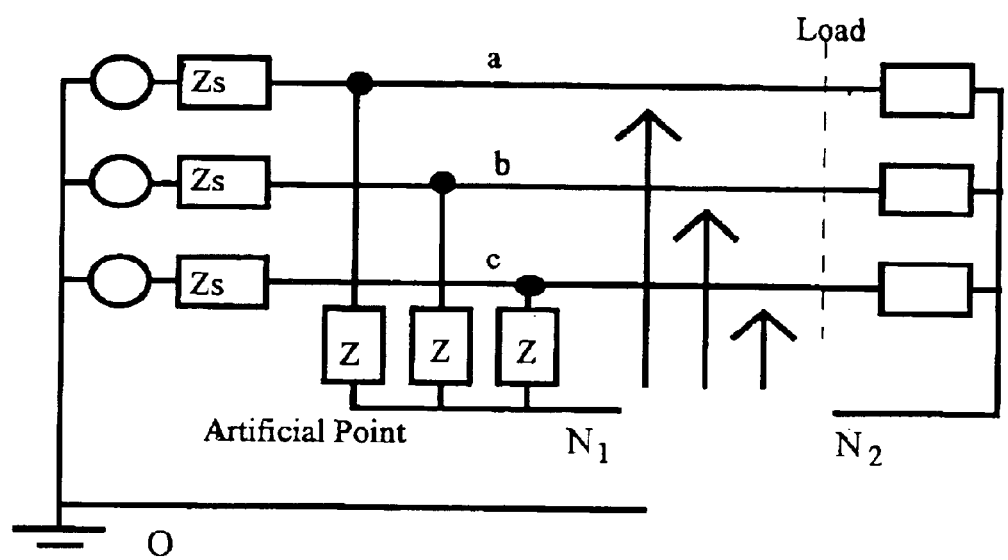
FIG. 1 is a schematic circuit diagram showing a conventional three-phase system with different reference points for voltage measurement.
Figure 2:
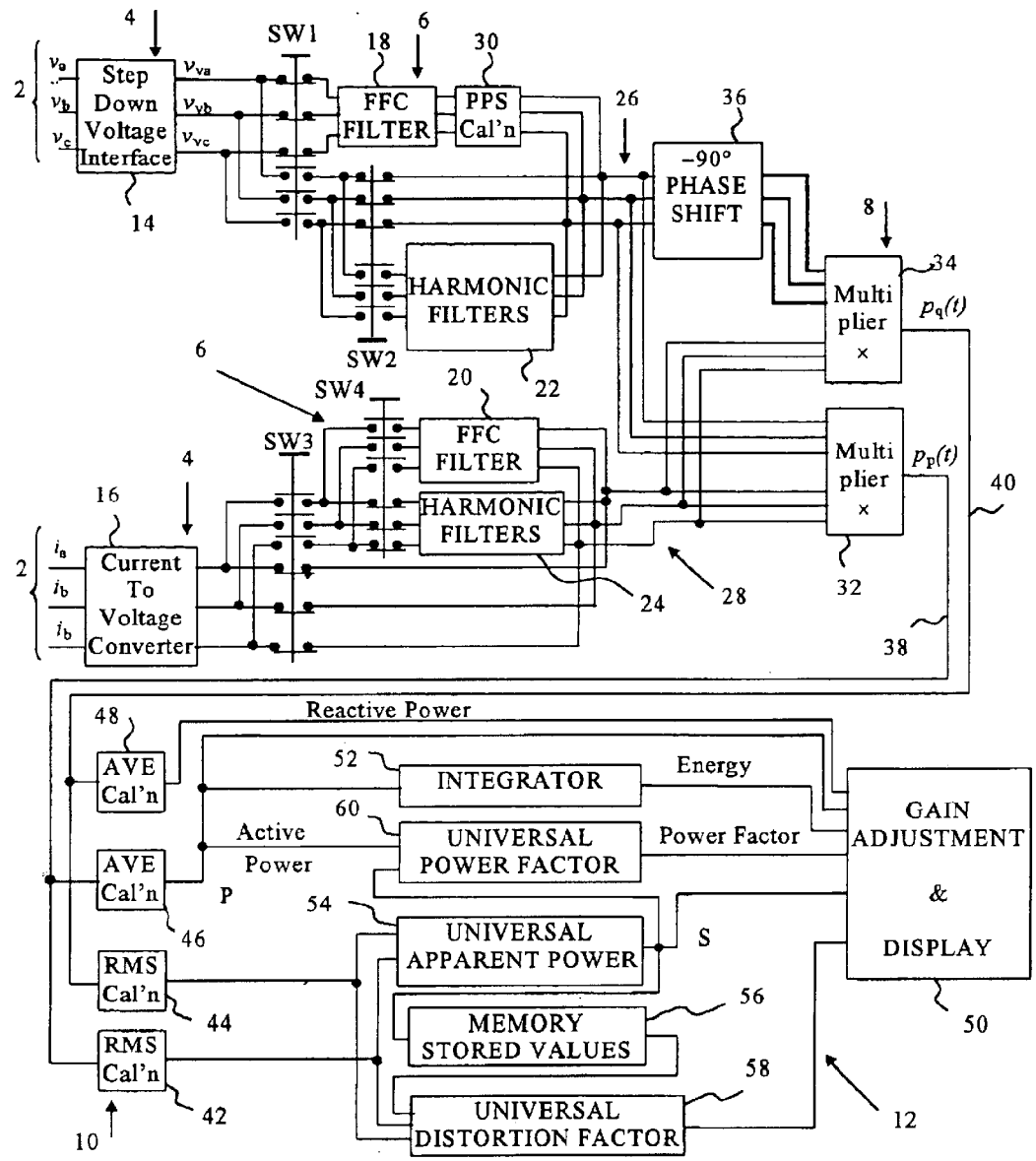
FIG. 2 is a schematic block diagram of a power measurement meter implementing a method of a first embodiment of the present invention.

Referring now to FIG. 2, there is shown a power measurement meter 1 which is used in carrying out a method of a preferred embodiment of the present invention. The power measurement meter 1 of this embodiment operates in the time-varying domain.

The power measurement meter 1 measures instantaneous voltage and current of a single-phase or three-phase electrical power supply system 2. From these measurements, the meter calculates the following power parameters: Universal Apparent Power, Fundamental Apparent Power, Harmonic Apparent Power, Universal Power Factor, Active Power, Reactive Power, Energy Consumption, voltage Distortion Factor, Current Distortion Factor and Universal Distortion Factor.

The electronic circuit of the meter 1 essentially comprises five different stages namely, a signal conversion stage 4, a switchable filtering stage 6, a combining stage 8, an averaging stage 10 and a power parameter calculation and display stage 12.

Taking each of these stages in turn, the conversion stage 4 of the electronic circuit comprises a step-down voltage interface 14 and a current-to-voltage converter 16. One side of the step-down voltage interface 14 is connected directly to the power supply system 2 being measured and the other side provides scaled down voltage signals $v_{va}$, $v_{vb}$, $v_{vc}$ representative of the magnitudes of voltage of the power supply system 2. Similarly, one side of the current-to-voltage converter 16 is connected directly to the power supply system 2 and the other side provides voltage signals $v_{ia}$, $v_{ib}$, $v_{ic}$ representative of the magnitudes of current of the power supply system 2. These outputs from the step-down voltage interface 14 and the current-to-voltage converter 16 are passed to the switchable filtering stage 6.

The switchable filtering stage 6 comprises two sets of fundamental-frequency component filters 18,20 and two sets of harmonic filters 22,24. A fundamental-frequency component filter 18,20 and a set of harmonic frequency filters 22,24 are provided for the outputs of each of the step-down voltage interface 14 and the voltage-to-current converter 16. In addition, four user-controllable switches SW1,SW2,SW3, SW4 are provided for enabling selection of the appropriate set of filters or for allowing the outputs of the conversion stage 4 to bypass the filters altogether. The filter stage 6 has two outputs 26,28, the first output 26 is the signal representing the power supply voltage, the second output 28 is the signal representing the power supply current.

The filtering stage 6 also comprises, for the signal representing the power supply voltage, a positive phase sequence (PPS) calculation unit 30 which is arranged to receive the output of the fundamental-frequency component filter 18. The PPS calculation circuit 30 is arranged to convert an unbalanced three-phase signal into a positive phase sequence of balanced components. This type of unit 30 is well known in the art and the details of its operation are not therefore provided. The output of the PPS calculation unit 30 is coupled to the first output 26 of the filtering stage 6 and can provide one of the possible outputs.

The user-selected outputs 26,28 of the filtering stage 6 provide the imputs for the combining stage 8 of the circuit. More particularly, The combining stage 8 comprises an active component multiplier unit 32 and a reactive component multiplier unit 34 which each act to multiply together two different supplied signals input from the filtering stage 6. The active component multiplier unit 32 receives an input directly from each of the above mentioned first and second outputs 26,28 of the filtering stage 6. However, the reactive component multiplier unit 34 only receives the second output 28 directly from the filtering stage 6. The first output 26 is modified by passing it through a $-90°$ phase shifting unit 36 before being input to the reactive component multiplier unit 34.

The two outputs 38,40 of the multiplying stage 8, which respectively represent the active and reactive power components of the instantaneous power of the power supply system 2, are next processed by the averaging stage 10. The averaging stage 10 comprises an active RMS calculation unit 42 and a reactive RMS calculation unit 44 which are supplied with the outputs 38,40 of the active component multiplier unit 32 ($p_p(t)$) and the reactive component multiplier 34 ($p_q(t)$) respectively. In addition, the averaging stage 10 has an active mean signal calculation unit 46 which is supplied with the output 38 of the active component multiplier unit 32, and a reactive mean signal calculation unit 48 which is supplied with the output 40 of the reactive component multiplier unit 34. The outputs of these RMS calculation units 42,44 and mean signal calculation units 46,48 are provided to the power parameter calculation and display stage 12.

The reactive mean signal calculation unit 48 simply calculates the mean of the reactive component ($p_q(t)$) of the instantaneous power of the electrical power supply system 2. The output of the reactive mean signal calculation unit 48, which represents the Reactive Power (Q) of the electrical power supply system 2, is supplied directly to a gain adjustment and display unit 50 where it can be displayed as a measured value to the meter user. Gain adjustment is required to normalise measured values for display and to compensate for the differences in the results for the measurement of a three-phase or a single-phase electrical power supply, for example.

Similarly, the active mean signal calculation unit 46 calculates the mean of the active component ($p_p(t)$) of the instantaneous power of the electrical power supply system 2. The output of the active mean signal calculation unit 46 represents the Active Power (P) of the electrical power supply system 2 and this is also supplied directly to the gain adjustment and display unit 50 for display.

The measured Active Power (P) is also supplied to an energy consumption measurement unit 52. Here the measured Active Power is integrated over a given time period and the result is the energy consumption over that time period. The energy consumption measurement unit 52 outputs its result to the gain adjustment and display unit 50 for display.

The active RMS calculation unit 42 and the reactive RMS calculation unit 44 calculate the RMS values of the active and reactive components of the instantaneous power ($p_p(t)$ and ($p_q(t)$) respectively. The outputs of each of these RMS calculation units 42,44 is supplied to a Universal Apparent Power calculation unit 54. This unit 54 is arranged to calculate the Universal Apparent Power, the Fundamental Apparent Power or the Harmonic Apparent Power of the power supply in dependence upon the filter selection in the switchable filtering stage 6. More specifically, when none of the outputs of the step-down voltage interface 14 and the voltage-to-current converter 16 are filtered, the RMS values are geometrically summed in this unit 54 to calculate the Universal Apparent Power (S), namely, the Universal Apparent Power is the root of the sum of the squares of the RMS values. When both of the outputs of the step-down voltage interface 14 and the voltage-to-current converter 16 are filtered by the harmonic frequency component filters 22,24 the unit calculates the Harmonic Apparent Power.

These calculated values for Universal Apparent Power and the Harmonic Apparent Power are output to the gain adjustment and display unit 50 for display. A further output is supplied to a memory unit 56 which stores the Universal Apparent Power or the Harmonic Apparent Power for subsequent use with a Universal Distortion Factor calculation unit 58.

The output of each of these RMS calculation units 42,44 is also supplied to the Universal Distortion Factor calculation unit 58. A further input is taken from the memory unit 56. The Universal Distortion Factor calculation unit 58 is arranged to calculate, in dependence upon the configuration of the switchable filtering stage 6, the Universal Distortion Power, the Current Distortion Factor or the Voltage Distortion Factor. These factors are dimensionless figures of merit which are ratios of Apparent Power and distortion power. More particularly, when the output of the step-down voltage interface 14 is filtered by the fundamental frequency component filter 18, and the output of the voltage-to-current converter 16 is filtered by the harmonic frequency component filters 24, the Current Distortion Factor is calculated. However, when the output of the step-down voltage interface 14 is filtered by the harmonic frequency component filters 24, and the output of the voltage-to-current converter 16 is filtered by the fundamental frequency component filter 20, the Voltage Distortion Factor is calculated.

The calculation of any of these Distortion Factors is a four-stage process which involves: firstly, calculating the Universal Apparent Power using a particular filter selection; secondly, storing the calculated value in the memory unit 56; thirdly, calculating the selected Distortion Power using a particular filter setting; and finally, calculating the ratio of the Distortion Power to the Universal Apparent Power. The output of the Universal Distortion Factor calculation unit 58 is supplied to the gain adjustment and display unit 50 for display to the user.

It is to be appreciated that whilst the outputs of the active and reactive RMS calculation units 42,44 have in themselves no significant meaning within the electrical power supply itself, they have great importance when they are used in the determination of the value of a desired power parameter. In the present case, these outputs are processed directly by the Universal Apparent Power calculation unit 54 and the Universal Distortion Factor unit 58.

The Universal Apparent Power value is also supplied to a Universal Power Factor calculation unit 60 together with the Active Power output (P) of the active mean signal calculation unit. The Universal Power Factor is calculated as the ratio of the measured Active Power to the measured Universal Apparent Power, namely P/S. This calculated value for Universal Power Factor is output to the gain adjustment and display unit 50 for display.

The selection of the appropriate switches (not all shown) on the meter allows the user to select the quantity to be measured and displayed.

Referring now to FIG. 3, a method of measuring the value of a power parameter using the meter 1 of FIG. 2 is now described. For the sake of convenience, the following description will assume that a three-phase AC power signal is being sensed, though the method is also applicable to a single-phase AC signal.

The method commences at 100 with the voltage $v_a$, $v_b$, $v_c$ and current $i_a$, $i_b$, $i_c$ of the power signal being sensed. The step-down voltage interface 14 scales down the sensed voltage range at 102 to voltage signals $v_{va}$, $v_{vb}$, $v_{vc}$ within a smaller predetermined acceptable voltage range for the circuit. Similarly, the current-to-voltage converter 16 transforms at 102 the sensed current signals $i_a$, $i_b$, $i_c$ into voltage signals $v_{ia}$, $v_{ib}$, $v_{ic}$ such that they are of same voltage magnitude range as that produced by the step-down voltage interface 14. Typically, the voltages are stepped down from 110 Volts to a range of ±10 Volts. The magnitude of the sensed current is also converted to a range of ±10 Volts.

The position of the filter switch SW1 determines at 104 whether or not the quantity being measured relates to network delivered power. In one position, where the quantity does relate to network delivered power, the voltages signals $v_{va}$, $v_{vb}$, $v_{vc}$ are filtered by the fundamental frequency component filter 18 at 106. Following this, the filtered voltage signals $v_{va}$, $v_{vb}$, $v_{vc}$ are passed to the PPS calculation unit 30 where the positive phase sequence is extracted at 108.

In the other position, where the quantity does not relate to network delivered power, the voltage signals $v_{va}$, $v_{vb}$, $v_{vc}$ are passed onto the switch SW2 which determines at 110 whether or not a distortion power calculation is to be carried out. If distortion power is to be calculated, the switch SW2 directs the voltage signals $v_{va}$, $v_{vb}$, $v_{vc}$ to the harmonics filters 22 where the voltage signals $v_{va}$, $v_{vb}$, $v_{vc}$ are filtered at 112 to extract the harmonics of the signals. Otherwise, the voltage signals $v_{va}$, $v_{vb}$, $v_{vc}$ are not filtered.

The resultant voltage signals $v_{va}$, $v_{vb}$, $v_{vc}$ from the PPS extraction at 108, the filtering at 112, or the non-filtering at 110, form the first output 26 of the switchable filtering stage 6. This first output 26 is passed directly to the instantaneous power calculation at 114 where the active component of instantaneous power $p_p(t)$ and the reactive component of instantaneous power ($p_q(t)$) are calculated. In addition, the first output 26 is shifted at 116 by a −90° phase shift and then passed on for the instantaneous power calculation at 114.

On the current sensing side of the procedure, the voltage signals $v_{ia}$, $v_{ib}$, $v_{ic}$ representative of the current of the power supply system 2 are determined at the signal scaling step at 102 of the procedure. These voltage signals $v_{ia}$, $v_{ib}$, $v_{ic}$ are then processed by the switchable filter stage 6 where the position of the filter switches SW3, SW4 determine at 118 whether or not a distortion power calculation is to be carried out. If distortion power is to be calculated, the switches SW3 and SW4 direct the voltage signals $v_{ia}$, $v_{ib}$, $v_{ic}$ to the harmonics filters 24 where the voltage signals $v_{ia}$, $v_{ib}$, $v_{ic}$ are filtered at 120 to extract the harmonics of the signals. Otherwise, the voltage signals $v_{ia}$, $v_{ib}$, $v_{ic}$ are not filtered.

The resultant voltage signals $v_{ia}$, $v_{ib}$, $v_{ic}$ from the filtering at 120, or the non-filtering at 118, form the second output 28 of the switchable filtering stage 6. This second output 28 is passed directly to the combining stage 8 where the instantaneous power calculation at 114 calculates the active component of instantaneous power $p_p(t)$ and the reactive component of instantaneous power $p_q(t)$. The relationship between the active and reactive components to the instantaneous power for a single-phase power supply has previously been stated in Equation 1. In three-phase the equivalent is given below:

$$p(t)=p_a(t)+p_b(t)+p_c(t) \qquad (2)$$

where p(t)=total complex instantaneous power $p_a(t)$=complex instantaneous power of phase a=$(v_{pa}+jv_{qa})$
$i_a=p_{pa}+jp_{qa}$
$p_b(t)$=complex instantaneous power of phase b=$(v_{pb}+jv_{qb})$
$i_b=p_{pb}+jp_{qb}$
$p_c(t)$=complex instantaneous power of phase c=$(v_{pc}+jv_{qc})$
$i_c=p_{pc}+jp_{qc}$ An equation representing the processing carried out on the voltage signals to determine at 114 the active and reactive components is given below:

$$p_p(t) = \text{(three-phase version)} = v_{pa}i_a + v_{pb}i_b + v_{pc}i_c \quad (3)$$

$$p_q(t) = \text{(Three phase version)} = v_{qa}i_a + v_{qb}i_b + v_{qc}i_c \quad (4)$$

where: $v_{pa}(t)$=instantaneous voltage of phase a $v_{pb}(t)$=instantaneous voltage of phase b $v_{pc}(t)$=instantaneous voltage of phase c $v_{qa}(t)$=instantaneous phase-shifted voltage of phase a $v_{qb}(t)$=instantaneous phase-shifted voltage of phase b $v_{qc}(t)$=instantaneous phase-shifted voltage of phase c $i_a(t)$=instantaneous current of phase a $i_b(t)$=instantaneous current of phase b $i_c(t)$=instantaneous current of phase c The two outputs 38,40 of the combining stage 8, representing the active and reactive components of the instantaneous power of the power supply, are subject to a mean signal calculation at 122 which determines the values for Active Power (P) and Reactive Power (Q) of the electrical power supply system 2. These power parameters (P and Q) are then gain adjusted and displayed to the meter user at 124. In addition, the Active Power is integrated at 126 to determine the energy consumption of the electrical power supply system 2. The thus determined energy consumption parameter is gain adjusted and displayed to the meter user at 124.

The active and reactive components of the instantaneous power of the power supply, are also supplied to the averaging stage 10 where an RMS calculation at 128 on each of the active and reactive power components is carried out. The following equations represent the processing at this stage:

$$\text{RMS}[p_p(t)] = \text{(three phase)} = \|p_p(t)\| = \sqrt{\left\{1/T \int_0^T [p_p(t)]^2 dt\right\}} \quad (5)$$

$$\text{RMS}[p_q(t)] = \text{(three phase)} = \|p_q(t)\| = \sqrt{\left\{1/T \int_0^T [p_q(t)]^2 dt\right\}} \quad (6)$$

where: $p_p$ and $p_p$ are as in equations (3) and (4)

The RMS calculations of each of the active and reactive power components are used to determine at 130 the Universal Apparent Power of the electrical power supply. This involves determining the root of the summation of the squares of the instantaneous power components as is set out below:

$$S = \sqrt{[\|p_p(t)\|^2 + \|p_q(t)\|^2]} \quad (7)$$

This power parameter (S) is then gain adjusted and displayed to the meter user at 124. In addition the Universal Apparent Power determined described above is used in the calculation of Universal Power Factor at 132 as a ratio of Active Power (P) to Universal Apparent Power (S). Furthermore, using the four-stage process described earlier but not shown in FIG. 3, the Universal Apparent Power is also stored in the memory unit 56 and used to determine at 134 the new quantity called Universal Distortion Factor. Both the Universal Power Factor and the Universal Distortion Factor are gain adjusted and displayed to the meter user at 124.

As has been described previously, the particular value of a power parameter determined by the Universal Apparent Power calculation at 130, by the Universal Power Factor calculation at 132, or by the Universal Distortion Factor calculation at 134, is dependent on the selected arrangement of the switchable filtering stage 6. Therefore, even though not shown on FIG. 3, other related power parameters can be calculated at steps 130, 132 and 134, by simply selecting the appropriate combination of filtering at the switchable filtering stage 6.

Figure 4:
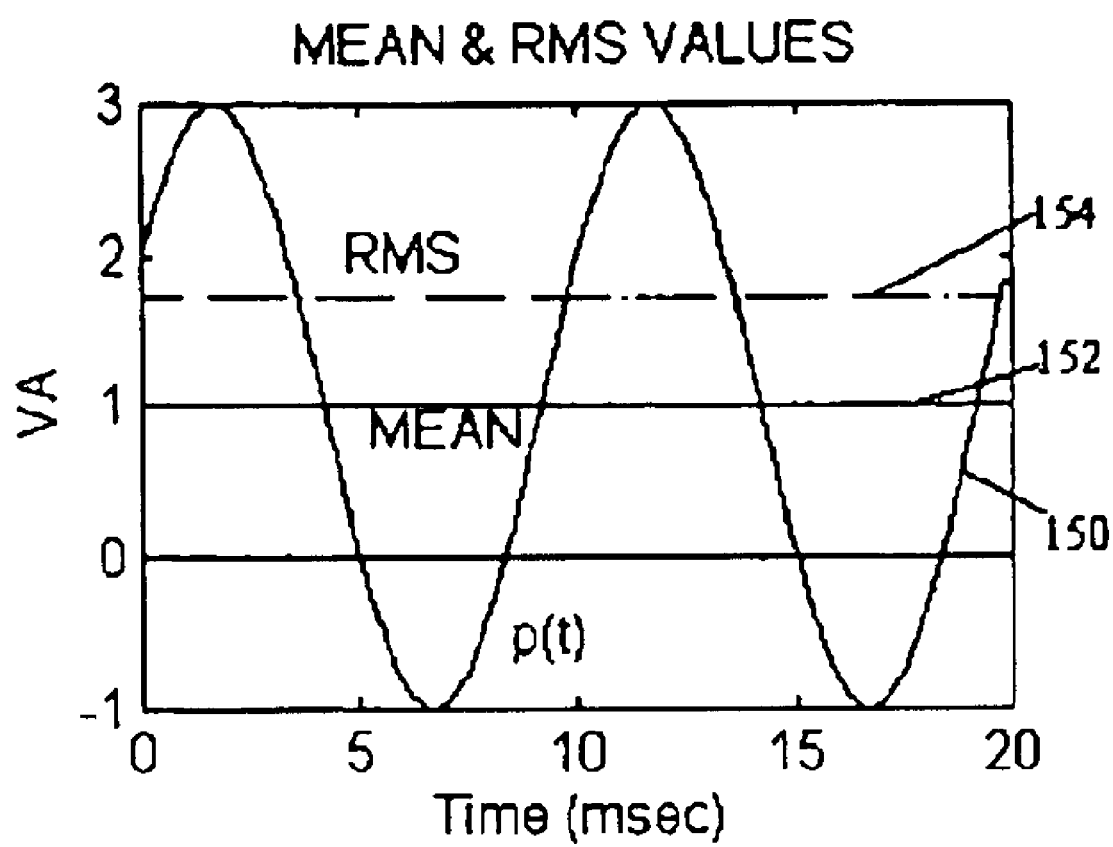
FIG. 4 is a graphical representation of an instantaneous power waveform showing the different averaging techniques used in the first embodiment of the present invention.

It is worth appreciating the difference between the two different types of averaging carried out at the averaging stage 10. The difference is clearly illustrated with reference to FIG. 4 of the accompanying drawings. Here an instantaneous power signal p(t) 150 in the form of a sine wave is shown. The mean value 152 of the signal 150, is the DC offset 152 about which the signal is oscillating symmetrically and this is shown to have a value of 1.0 on the VA scale. The RMS value 154 of the signal 150, can be seen to be greater than the mean value 152. This is because of the positive contribution made by the oscillatory component of the signal to the RMS calculation.

The above meter 1 can be readily implemented in both the digital and analogue domains. Also, whilst the above meter has been described as comprising of a plurality of processing units, it is possible for them to be replaced by a single processing unit which carries out all of the desired functions. The most practical example of this is for the single processing unit to be a microprocessor running a program implementing the desired functions by way of an algorithm. For example, the meter 1 could be implemented in an ASIC (Application Specific Integrated Circuit) in order to reduce component costs with the output of the signal conversion stage 4 being digitised before processing by the other stages.

The above method of the present invention has been tested through use of a computer simulation to determine how its measurements compare to those of conventional power measurement methods. This has been carried out under two general conditions: firstly for balanced and unbalanced linear loads; and secondly, for balanced and unbalanced non-linear loads. The simulation analysis has been carried using ElectroMagnetic Transient Programme (EMPT) which is a universally accepted software program for power system simulation.

Referring to Table 1, simulation results are given for balanced/unbalanced linear loads. The results show Universal Apparent Power and Universal Power Factor ('UAP' and 'UF') using the method embodying the present invention, and conventional Arithmetic 'RMS' and System definitions of Apparent Power and Power Factor.

In the case of a three-phase balanced load with sinusoidal waveforms (Tests A and B), the three methods used give identical results, as expected. No values are quoted for the NDP

TABLE 1

Simulation results for unbalanced loads showing Apparent Power and Power Factor using the new method ('UAP' and 'UF'), 'RMS' and 'System' definitions

| | Load Impedances | | | Load | | Load PPS | | Load | | | | | |
|---|---|---|---|---|---|---|---|---|---|---|---|---|---|
| | | | | | | | | Apparent Power | | | Power factor | | |
| Test | $Z_a$ | $Z_b$ | $Z_c$ | P | Q | $P^+$ | $Q^+$ | UAP | RMS | SYS | UF | RMS | SYS |
| A | 30 + j0 | 30 + j0 | 30 + j0 | 827.2 | 0.0 | 827.2 | 0.0 | 827.2 | 827.2 | 827.2 | 1.000 | 1.000 | 1.000 |
| B | 22.059 + j13.235 | 22.059 + j13.235 | 22.059 + j13.235 | 642.6 | 385.6 | 642.6 | 385.6 | 749.4 | 749.4 | 749.4 | 0.857 | 0.857 | 0.857 |
| C | 9.615 + j1.923 | 22.059 + j13.235 | 22.059 + j13.235 | 840.4 | 339.5 | 856.1 | 402.2 | 927.7 | 919.8 | 1028.0 | 0.906 | 0.914 | 0.818 |
| D | 9.615 + j1.923 | 9.231 + j13.846 | 22.059 + j13.235 | 779.2 | 440.4 | 795.5 | 505.8 | 923.6 | 945.8 | 1022.9 | 0.844 | 0.824 | 0.762 |
| E | 9.730 + j1.622 | 9.231 + j13.846 | 19.512 + j24.390 | 704.8 | 461.3 | 725.3 | 543.4 | 870.0 | 911.0 | 1008.7 | 0.810 | 0.774 | 0.969 |
| F | OPEN | 17.241 + j6.897 | 17.241 + j6.897 | 582.4 | 232.9 | 604.9 | 323.0 | 701.2 | 627.2 | 855.1 | 0.831 | 0.928 | 0.681 |
| G | 20 + j0 | OPEN | OPEN | 365.0 | 0.0 | 389.3 | 97.3 | 516.1 | 365.0 | 705.8 | 0.707 | 1.000 | 0.517 |

| | Load PPS | | | | | |
|---|---|---|---|---|---|---|
| | Apparent Power | | | Power factor | | |
| Test | UAP | RMS | SYS | UF | RMS | SYS |
| A | 827.2 | — | 827.2 | 1.000 | — | 1.000 |
| B | 749.4 | — | 749.4 | 0.857 | — | 0.857 |
| C | 979.4 | — | 1011.8 | 0.874 | — | 0.831 |
| D | 995.9 | — | 1004.0 | 0.799 | — | 0.762 |
| E | 966.6 | — | 985.4 | 0.750 | — | 0.715 |
| F | 766.6 | — | 839.8 | 0.789 | — | 0.693 |
| G | 567.5 | — | 695.0 | 0.686 | — | 0.525 |

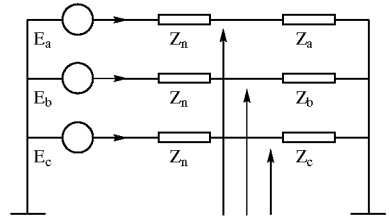

$E_a = 100 \angle 0$
$E_b = 100 \angle -120$
$E_c = 100 \angle 120$
$Z_n = 2 + j8$ (Network Delivered Power) RMS Apparent Power and Power Factor because they are not defined in the RMS convention.

It is to be noted that in the extremely unbalanced situation illustrated in test G, the load PPS Reactive Power is 97.3 VAr where the load is a pure resistance. This is equal to the Reactive Power demanded by the source negative and zero phase sequence (NPS, ZPS) impedances. The load converts, in this situation, all of the PPS Reactive Power into NPS and ZPS Reactive Power which is injected back to the system to be used by the source impedance.

The results obtained by the three methods are different in the case of unbalanced loads, again in line with expectation.

Referring to Table 2, simulation results are given for non-linear loads in balanced and non-balanced conditions. The results show Universal Apparent Power and Universal Power Factor ('UAP' and 'UF') using the method embodying the present invention, and conventional RMS and System definitions of Apparent Power and Power Factor.

In this case, the EMTP simulation package was used to model a three-phase, phase controlled thyristor system. This simulation allows different, non-linear load conditions to be tested.

Tests H, M, T and Y are similar to tests A and B shown in Table 1. In these cases, a balanced load is used, and the thyristor firing angle is zero, resulting in an undistorted waveform. The other tests were carried out with firing angles of 72° and 144° to give strong harmonic content to the voltage and current waveforms. In these circumstances, the three methods give different results. Generally speaking, the RMS and System Apparent Powers give similar results for a balanced load that is supplied with distorted or sinusoidal waveforms. This can also be analytically proved to be true. The difference between these two definitions is particularly clear when the load is unbalanced.

With all three methods, Power Factor and UF reduces as the firing angle increases.

Sub-sets of the tests involved evaluating the effect of different earthing arrangements. An artificial reference point was realised by connecting a star of high-value resistors in parallel with load. The star point of this combination was used as the reference point for voltage measurement.

TABLE 2

Simulation results for non-linear loads showing Apparent Power and Power Factor using the new method ('UAP' and 'UF'), 'RMS' and 'System' definitions

| Test | Load Impedances | | | Firing Angle | Load | | Load PPS | | Load | | | | | |
|---|---|---|---|---|---|---|---|---|---|---|---|---|---|---|
| | | | | | Active Power | Reactive Power | Active Power | Reactive Power | Apparent Power | | | Power Factor | | |
| | Za | Zb | Zc | | P | Q | P+ | Q+ | UAP | RMS | SYS | UF | RMS | SYS |
| H | 20 + j0 | 20 + j0 | 20 + j0 | 0 | 8,117 | — | 8,177 | — | 8,177 | 8,177 | 8,177 | 1.000 | 1.000 | 1.000 |
| I | 20 + j0 | 20 + j0 | 20 + j0 | 72 | 7,423 | 1,195 | 7,443 | 1,321 | 7,623 | 7,789 | 7,789 | 0.974 | 0.953 | 0.953 |
| J | 20 + j0 | 20 + j0 | 20 + j0 | 144 | 1,762 | 1,992 | 1,804 | 2,244 | 2,909 | 3,854 | 3,854 | 0.606 | 0.457 | 0.457 |
| K | 20 + j0 | | | 0 | 2,677 | — | 2,744 | 134 | 3,786 | 2,677 | 4,762 | 0.707 | 1.000 | 0.562 |
| L | 20 + j5 | 20 + j5 | 20 + j5 | 72 | 6,655 | 2,704 | 6,660 | 2,749 | 7,215 | 7,292 | 7,292 | 0.922 | 0.913 | 0.913 |
| M | 20 + j0 | 20 + j5 | 20 + j5 | 0 | 7,549 | 1,889 | 7,549 | 1,889 | 7,782 | 7,782 | 7,782 | 0.970 | 0.970 | 0.970 |
| N | 10 + j0 | 20 + j0 | 25 + j0 | 0 | 9,354 | — | 9,369 | 30 | 9,593 | 9,354 | 10,029 | 0.975 | 1.000 | 0.933 |
| O | 10 + j0 | 20 + j0 | 25 + j0 | 0 | — | — | — | — | — | — | 9,623 | — | — | 0.972 |
| P | 10 + j5 | 10 + j5 | 10 + j5 | 72 | 9,890 | 6,774 | 9,893 | 6,821 | 12,028 | 12,495 | 12,495 | 0.822 | 0.792 | 0.792 |
| Q | 10 + j5 | 10 + j5 | 10 + j5 | 72 | — | — | — | — | — | — | 12,075 | — | — | 0.819 |
| R | 10 + j0 | 20 + j0 | 25 + j0 | 0 | 9,354 | 0 | 9,369 | 30 | 9,593 | 9,500 | 9,623 | 0.975 | 0.985 | 0.972 |
| S | 10 + j5 | 10 + j5 | 10 + j5 | 72 | 9,890 | 6,774 | 9,893 | 6,821 | 12,028 | 12,075 | 12,075 | 0.822 | 0.819 | 0.819 |
| T | 10 + j0 | 10 + j0 | 10 + j0 | 0 | 36,562 | — | 36,562 | — | 36,562 | 36,562 | 36,562 | 1.000 | 1.000 | 1.000 |
| U | 10 + j0 | 10 + j0 | 10 + j0 | 72 | 32,597 | 5,554 | 32,675 | 6,389 | 33,390 | 34,477 | 34,484 | 0.976 | 0.946 | 0.945 |
| V | 10 + j0 | 10 + j0 | 10 + j0 | 72 | — | — | — | — | — | — | 34,484 | — | — | 0.945 |
| W | 10 + j5 | 10 + j5 | 10 + j5 | 144 | 488 | 3,623 | 510 | 3,858 | 4,318 | 4,690 | 4,690 | 0.113 | 0.104 | 0.104 |
| X | 10 + j5 | 10 + j5 | 10 + j5 | 144 | — | — | — | — | — | — | 4,690 | — | — | 0.104 |
| Y | 10 + j0 | 10 + j0 | 10 + j0 | 0 | 36,562 | — | 36,562 | — | 36,562 | 36,562 | 36,562 | 1.000 | 1.000 | 1.000 |
| Z | 10 + j0 | 10 + j0 | 10 + j0 | 72 | 32,570 | 5,554 | 32,675 | 6,389 | 33,390 | 34,476 | 34,485 | 0.976 | 0.946 | 0.945 |
| AA | 10 + j5 | 10 + j5 | 10 + j5 | 144 | 488 | 3,623 | 510 | 3,858 | 4,318 | 4,690 | 4,690 | 0.113 | 0.104 | 0.104 |

| Test | Load PPS | | | | | | Earth | Comments |
|---|---|---|---|---|---|---|---|---|
| | Apparent Power | | | Power Factor | | | | |
| | UAP | RMS | SYS | UF | RMS | SYS | | |
| H | 8,177 | 8,177 | 8,177 | 1.000 | 1.000 | 1.000 | A | |
| I | 7,654 | 7,751 | 7,751 | 0.973 | 0.960 | 0.960 | A | |
| J | 3,152 | 3,821 | 3,821 | 0.572 | 0.472 | 0.472 | A | |
| K | 3,885 | 2,747 | 4,758 | 0.706 | 0.899 | 0.577 | A | |
| L | 7,238 | 7,283 | 7,283 | 0.920 | 0.915 | 0.915 | A | |
| M | 7,782 | 7,782 | 7,782 | 0.970 | 0.970 | 0.970 | A | |
| N | 9,621 | 9,507 | 9,621 | 0.974 | 0.986 | 0.974 | B | Measured wrt load star point |
| O | — | — | 9,621 | — | — | 0.974 | B | Measured wrt line voltage equipment. |
| P | 12,057 | 12,057 | 12,057 | 0.821 | 0.821 | 0.821 | B | Measured wrt load star point |
| Q | — | — | 12,057 | — | — | 0.821 | B | Measured wrt line Voltage equipment. |
| R | 9,621 | 9,507 | 9,621 | 0.974 | 0.986 | 0.974 | C | |
| S | 12,057 | 12,057 | 12,057 | 0.821 | 0.821 | 0.821 | C | |
| T | 36,562 | 36,562 | 36,562 | 1.000 | 1.000 | 1.000 | D | |
| U | 33,537 | 33,532 | 33,537 | 0.974 | 0.974 | 0.974 | D | Measured wrt line Vs & Phase Is |
| V | — | — | 33,537 | — | — | 0.974 | D | Measured wrt line Vs & Is |
| W | 4,664 | 4,664 | 4,664 | 0.109 | 0.109 | 0.109 | D | Measured wrt line Vs & Phase Is |
| X | — | — | 4,664 | — | — | 0.109 | D | Measured wrt line Vs & Is |
| Y | 36,562 | 36,562 | 36,562 | 1.000 | 1.000 | 1.000 | E | |
| Z | 33,537 | 33,532 | 33,537 | 0.974 | 0.974 | 0.974 | E | |
| AA | 4,664 | 4,664 | 4,664 | 0.109 | 0.109 | 0.109 | E | |

Line Impedances
Zero sequence, $Z_c$ = 1 + 2j
Positive sequence, $Z_n$ = 0.5 + j
Earthing schemes
A Grounded Star.
B Un-Grounded Star
C Un-Grounded Star Load, Artificial Reference Point.
D Delta Connection
E Delta Connection, Artificial Reference Point.

In cases where only the system Apparent Power has been specific, and other power quantities have been designated as blank, Active and Reactive Power cannot be deduced from the voltages and currents used in Apparent Power calculation.

Figure 5:
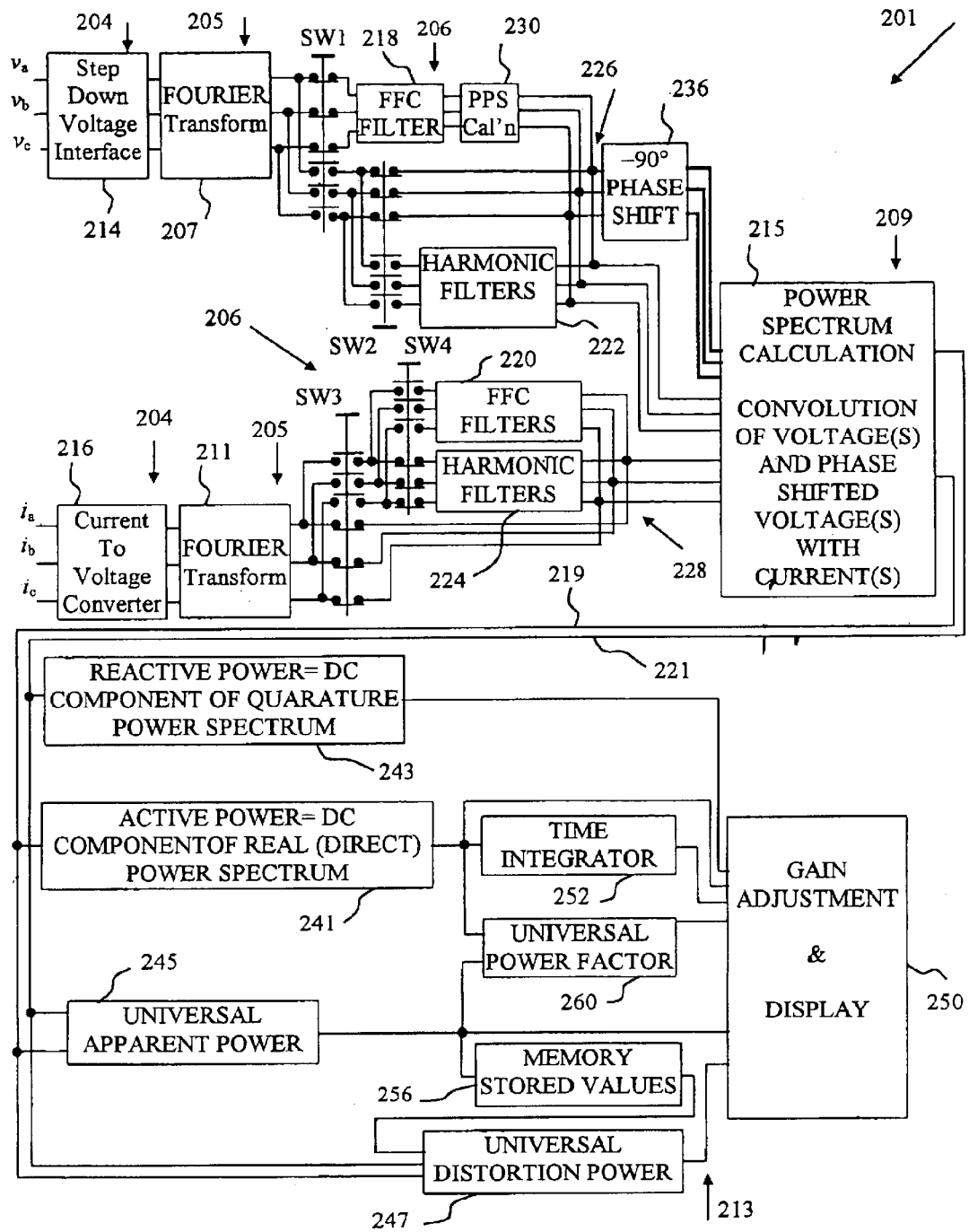
FIG. 5 is a schematic block diagram of a power measurement meter implementing a method of a second embodiment of the present invention.

Referring now to FIG. 5, there is shown a power measurement meter 201 which is used in carrying out a method of another preferred embodiment of the present invention. The power measurement meter 201 of this embodiment operates in the frequency-varying domain and will be referred hereinafter as the FD meter 201.

The FD meter 201 is arranged to implement a method which is equivalent to that of the first embodiment, but in the frequency domain. The resultant measurements of power quantities (parameters) from the FD meter 201 are equivalent to that of the time-domain power meter 1 of the first embodiment. There are similarities between the two embodiments (c.f FIGS. 2 and 5) and to avoid unnecessary repetition, the following description of the FD meter 201 is directed to those differences. Where components of the FD meter 201 are identical those of co the time-domain power meter 1, the same reference numerals with a constant prefix (of '2') have been used to label those components.

The electronic circuit of the FD meter 201 comprises five different stages namely, a signal conversion stage 204, a signal transform stage 205, a switchable filtering stage 206, a combining stage 209, and a power parameter calculation and display stage 213. The signal conversion stage 204 and the switchable filtering stage 206 are identical in function to those of the first embodiment and so will not be described further.

The outputs of the conversion stage 204, namely the voltage signals $v_{va}$, $v_{vb}$, $v_{vc}$ and $v_{ia}$, $v_{ib}$, $v_{ic}$ are converted into the frequency domain at the signal transform stage 205 by two Fourier Transform units 207,211. These transform units 207,211 are well understood in the art for performing a standard transformation into the frequency domain and as such, no further description of their function is required. The outputs of the two Fourier Transform units 207,211, which are each in the form of a frequency spectrum, are supplied as inputs to the switchable filtering stage 206.

The user-selected outputs 226,228 of the filtering stage 206 provide the inputs for the combining stage 209 of the circuit. More particularly, the combining stage 209 comprises a power spectra calculation unit 215 which acts to convolve three different inputs together to form a first and a second component intantaneous power spectra. The power spectra calculation unit 215 receives an input directly from each the above mentioned first and second outputs 226,228 of the filtering stage 206. These two signals are convolved into a first component instantaneous power spectrum 219.

The combining stage 209 receives a further input which is the first output 226 of the filtering stage 206 modified by passing it through a −90° phase-shifting unit 236. This phase-shifted signal is convolved with the second output 228 of the filtering stage 206 into a second component instantaneous power spectrum 221. The process of convolution is well understood in the art and so requires no further explanation.

The first and second component instantaneous power spectra 219,221 are output from the combining stage 209 and supplied to the power parameter calculation and display stage 213. Here, the various power parameters can be determined relatively simply from the various components of the instantaneous power spectra 219,221 as is described below.

The power parameter calculation and display stage 213 comprises an Active Power calculation unit 241 to which the first component instantaneous power spectrum 219 is supplied. The Active Power is simply calculated as the DC component of the first component instantaneous power spectrum 219. Similarly, a Reactive Power calculation unit 243 is provided to which the second component instantaneous power spectrum 221 is supplied. The Reactive Power is simply calculated as the DC component of the second component instantaneous power spectrum 221.

The Universal Apparent Power is measured at the Universal Apparent Power calculation unit 245 by combining the first and second component power spectra 219,221. More specifically, the Universal Apparent Power is determined by calculating the square root of the sum of the squares of the frequency components of the first and second component power spectra 219,221.

The remaining parts of the power parameter calculation and display stage 213 are almost identical to those of the previous embodiment and accordingly no further description of the function of these units is given. However, one minor difference is that the Universal Distortion Factor calculation unit 247 receives the first and second component power spectra 219,221 as inputs.

It is to be appreciated that the desired power quantities can be derived from the first and second calculated power spectra 219,221 without the need for an averaging stage 10 as is needed in time-domain calculations of the previous embodiment. This advantageously reduces component cost and circuit complexity. Furthermore, the electronic circuit of a FD meter 201 is far more readily implemented as a digital device than the electronic circuit of a time-domain meter.

Figure 6:
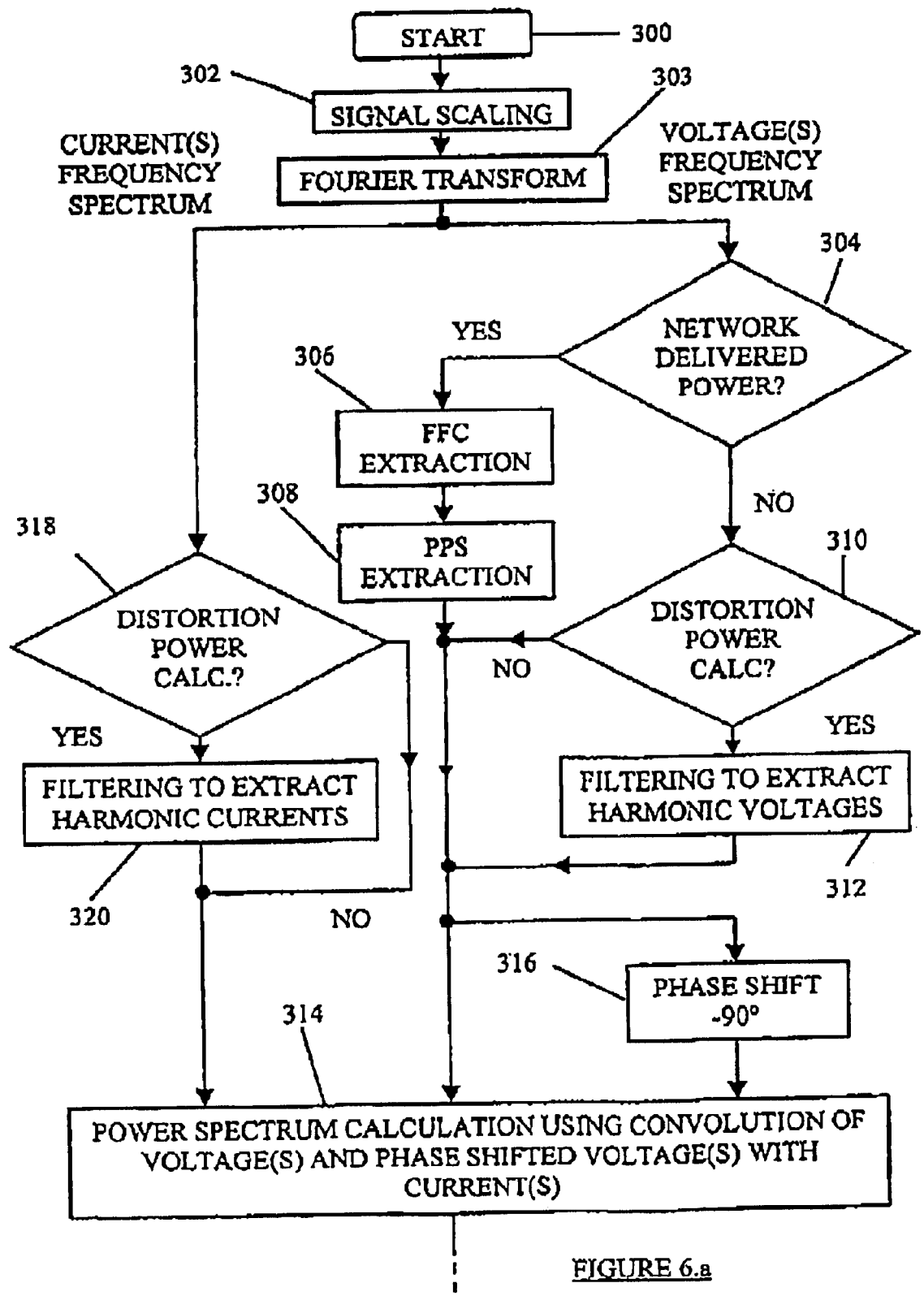
FIG. 6 is a flow diagram showing the steps involved in the implementation of the method of the second embodiment of the present invention.
Figure 7:
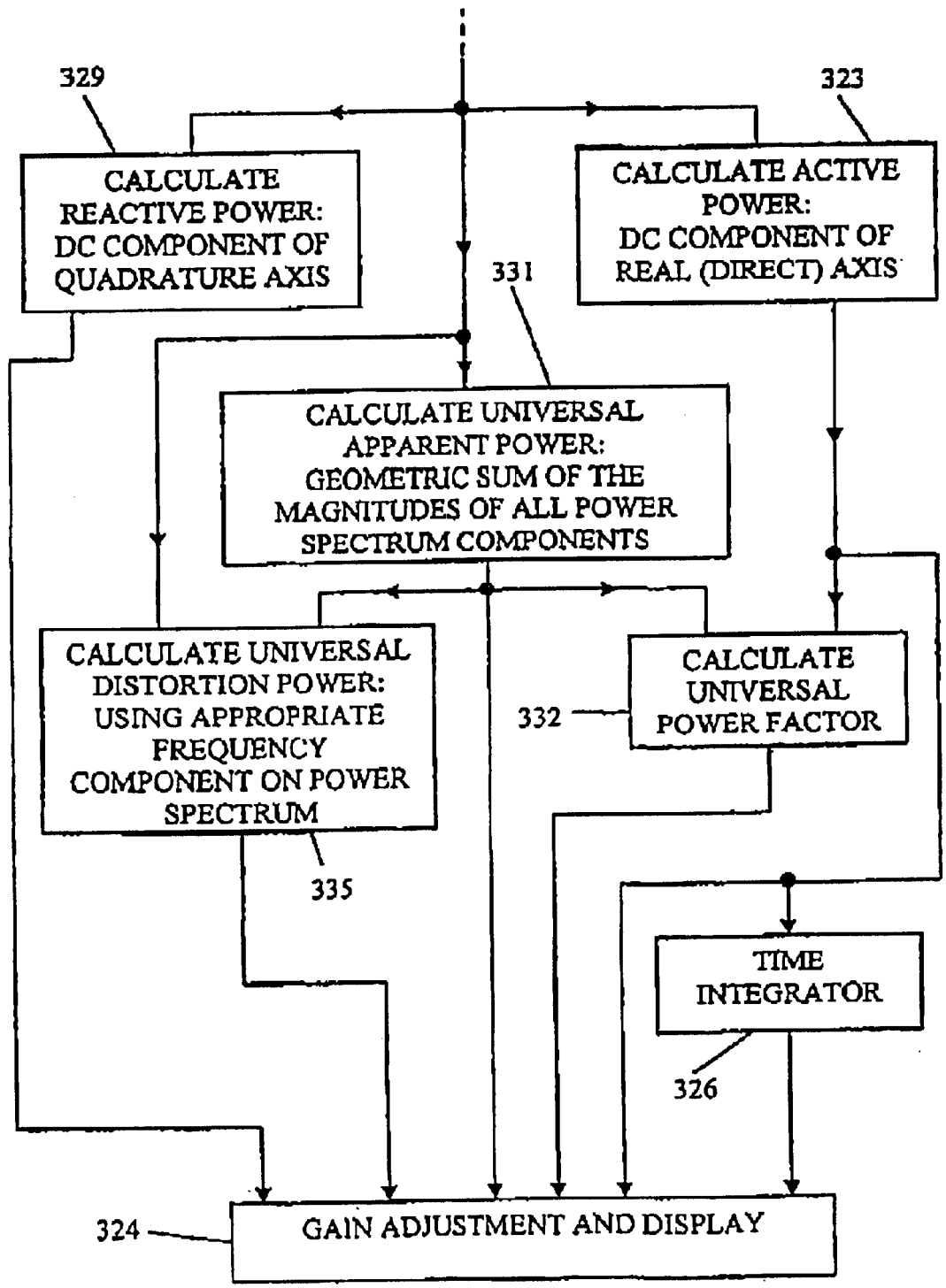
FIGS. 7a and 7b are diagrammatic representations of the frequency spectra of voltage and current for the single-phase AC power circuit.
Figure 10:
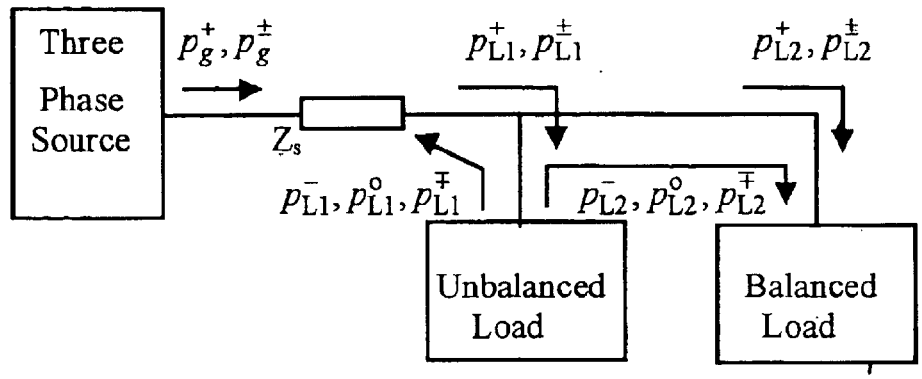
FIG. 10 is a schematic circuit diagram of a three-phase source and load circuit showing the flow of instantaneous power components with balanced and unbalanced loads.
Figure 11:
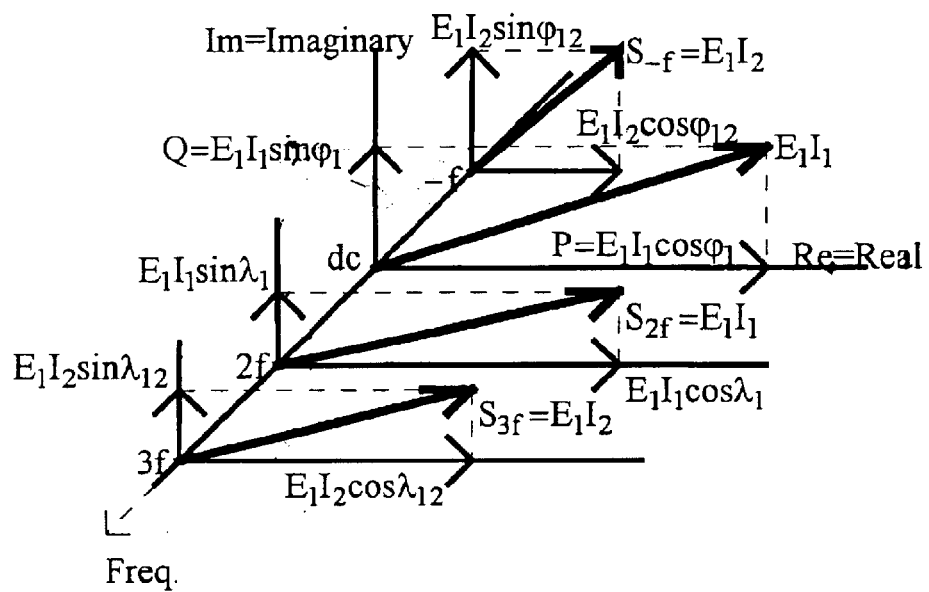
FIG. 11 is a phasor diagram of the frequency spectrum of the instantaneous power of a non-sinusoidal three-phase AC power circuit.

Referring now to FIG. 6, a method of measuring the value of a power parameter using the FD meter 201 of FIG. 5 is now described. As in the previous embodiment, the following description will assume that a three-phase AC power signal is being sensed, though the method is also applicable to a single-phase AC signal.

The method of measuring an electric power parameter using the above described FD meter is equivalent to that of the first embodiment, but in the frequency domain. There are a significant number of common procedural steps between the two embodiments (c.f FIGS. 3 and 6) and to avoid unnecessary repetition, the following description of the frequency domain power parameter measurement will only briefly mention the similarities. Where components of the FD meter 201 are identical those of the time-domain power meter 1, the same reference numerals with replacement prefix (of '3') have been used to label those components.

The method commences at 300 with the voltage $v_a$, $v_b$, $v_c$ and current $i_a$, $i_b$, $i_c$ of the power signal being sensed. These signals are scaled down at 302 to voltage signals $v_{va}$, $v_{vb}$, $v_{vc}$ and $v_{ia}$, $v_{ib}$, $v_{ic}$ respectively. Then a frequency-domain representation (a frequency spectrum) of each of these voltage signals $v_{va}$, $v_{vb}$, $v_{vc}$ and $v_{ia}$, $v_{ib}$, $v_{ic}$ is obtained by performing at 303 a Fourier transform on each of the voltage signals $v_{va}$, $v_{vb}$, $v_{vc}$ and $v_{ia}$, $v_{ib}$, $b_{ic}$.

The frequency spectrum of the voltage signals $v_{va}$, $v_{vb}$, $v_{vc}$ is then filtered at 306 to extract its fundamental frequency component and subsequently a positive phase sequence is extracted at 308 if the network delivered power is being measured at 304. Otherwise, if a distortion power calculation is required at 310, the frequency spectrum of the voltage signals $v_{va}$, $v_{vb}$, $v_{vc}$ is then filtered at 312 to extract its harmonic voltages. The outputs of the PPS extraction at 308, the harmonic filtering at 312 and the non-filtered spectra determined at 310 together provide the first output 226 of the filtering stage 206.

This first output 226,228 then divided into two spectra, one where is phase shifted by −90° to give a quadrature representation of the voltage signal $v_{va}$, $v_{vb}$, $v_{vc}$ and the other which is not phase shifted at all.

The frequency spectrum of the current related voltage signals $v_{ia}$, $v_{ib}$, $v_{ic}$ are, if a distortion power calculation is required at 318, filtered at 320 to extract its harmonic voltages. This provides the second output 228 of the filtering stage 206.

The spectrum of the second output 228 and the two divided spectra of the first output 226 are processed in a power spectrum calculation at 315. Here the frequency spectra of the non-phase shifted first output 226 and the second output 228 are convoluted together to form the active component power spectrum 219. Also the frequency spectrum of the second output 228 and the frequency spectrum of the phase-shifted first output 226 are convoluted together at 315 to form the reactive component power spectrum 221.

Both of the active and reactive component power spectra 219,221 are forwarded to the power parameter calculation and display stage 213. Here, the Active Power is calculated at 323 as the DC component of the active component power spectrum 219. In addition, the Reactive Power is calculated at 329 as the DC component of the reactive component power spectrum 221. The Universal Apparent Power is simply calculated at 331 as the geometric sum of the magnitudes of all the power spectra components, namely by calculating the root of the sum of the squares of each of the elements of the active and reactive component power spectra 219,221.

The Universal Distortion Factor is calculated at 335 by considering both the active and reactive component power spectra 219,221 and the Universal Apparent Power stored in the memory unit 256 (not shown in FIG. 6).The calculation of Universal Power Factor at 332 and the Energy Consumption at 326 is equivalent to that described in the previous embodiment. Similarly, the gain adjustment and display at 324 is no different to that previously described.

In the frequency domain the spectrums of the active and reactive components of instantaneous power ($P_p(f)$, $P_q(f)$) are determined by the following equations:

$$P_p(f)=V_{pa}(f)*I_a(f)+V_{pb}(f)*I_b(f)+V_{pc}(f)*I_c(f)$$

$$P_q(f)=V_{qa}(f)*I_a(f)+V_{qb}(f)*I_b(t)+V_{qc}(f)*I_c(f)$$

Where *=convolution of the signals.

$V_{pa}(f)$=original voltage spectrum of phase a
$V_{pb}(f)$=original voltage spectrum of phase b
$V_{pc}(f)$=original voltage spectrum of phase c
$I_a(f)$=original Current spectrum of phase a
$I_b(f)$=original current spectrum of phase b
$I_c(f)$=original current spectrum of phase c In both of the above described embodiments, the output of the fundamental frequency component filter 18,218 always is supplied to the PPS calculation unit 30,230. It should be noted that when the three-phase power supply is balanced or only a single-phase power supply is being monitored, there is no need for a positive phase sequence. In these cases, the output of the PPS calculation unit 30,230 will make virtually no difference to the result. In the case of a single-phase supply, the value obtained as the first output 26,226 of the filtering stage 6,206 will need to be multiplied by three times to give the correct value. However, as this is a constant value, the gain adjustment step 124,324 at the very end of the process can compensate for this difference. This could for example be programmed into an algorithm such that the compensation was automatic.

It is to be appreciated that, whilst a phase shift is carried out on only the voltage signal to produce the −90° phase shift, it is possible to carry out a phase shift of the current signal to produce the same effect. This can be extended to a situation where both the voltage and current signals could each be phase shifted by amounts which result in the effective (relative) phase shift being equivalent to the −90° carried out in the above-described embodiments.

The present invention is based on a novel appreciation of the definitions of electric power parameters. These definitions are the subject of complex mathematical analysis which is necessary to explain the characteristics of single-phase and multiphase power distribution. In order to better understand the new theories underlying the present invention, reference should be made to a paper presented in three parts, authored by the inventor, Foroozan Ghassemi, entitled "A New Concept In AC Power Theory", and published in the IEE Proceedings, Pt C, Vol. 147, No. 6, 2000.

Having described particular preferred embodiments of the present invention, it is to be appreciated that the embodiments in question are exemplary only and that variations and modifications such as will occur to those possessed of the appropriate knowledge and skills may be made without departure from the spirit and scope of the invention as set forth in the appended claims. For example, whilst the present invention has been described as a meter, the method employed in the operation of the meter could be used for monitoring of power parameters whilst load conditions are being varied or are fluctuating.

What is claimed is:

1. A method of measuring the value of an electrical power parameter of an electrical power signal, the method comprising:
   calculating a first instantaneous power component as the product of an instantaneous voltage signal of the electrical power signal and an instantaneous current signal of the electrical power signal;
   carrying out a relative phase shift between the instantaneous voltage signal and the instantaneous current signal;
   calculating a second instantaneous power component as the product of the relatively phase-shifted instantaneous voltage and instantaneous current signals;
   RMS averaging each of the first and second power components to determine their respective magnitudes; and
   using both of the calculated magnitudes, as determined from the RMS averaging step, to determine the value of the electrical power parameter.

2. A method according to claim 1, wherein the step of carrying out a relative phase shift comprises phase shifting the instantaneous voltage of the electrical power signal prior to calculating the second instantaneous power component.

3. A method according to claim 1, wherein the step of carrying out a relative phase shift comprises carrying out a relative phase shift of 90 degrees.

4. A method according to claim 1, further comprising determining the Apparent Power of the electrical power signal by calculating the square root of the sum of the squares of the RMS values of the first and second instantaneous power components.

5. A method according to claim 4, further comprising:
   measuring the mean value of the first instantaneous power component to determine the Active Power of the electrical power signal; and
   calculating the ratio of measured Active Power of the electrical power signal to the measured Apparent Power of the electrical power signal, the value of the ratio being the Power Factor of the electrical power signal.

6. A method according to claim 1, further comprising measuring the mean value of the first instantaneous power component to determine the Active Power of the electrical power signal.

7. A method according to claim 6, further comprising integrating the Active Power value over time to determine the Energy Consumption of the electrical power signal.

8. A method according to claim 1, further comprising measuring the mean value of the second instantaneous power component to determine the Reactive Power of the electrical system.

9. A method according to claim 1, further comprising filtering at least one of the instantaneous voltage or instantaneous current signals of the electrical power signal, prior to their use in the calculating steps.

10. A method according to claim 9, wherein the filtering step results in the fundamental frequency component of at least one of the instantaneous voltage or instantaneous current signals being obtained.

11. A method according to claim 9, wherein the filtering step results in at least one of the harmonic frequency components of at least one of the instantaneous voltage or instantaneous current signals being obtained.

12. A method according to claim 9, wherein the filtering step comprises:

filtering the instantaneous voltage signal to obtain its fundamental frequency components; and using the filtered instantaneous voltage signal and the unfiltered instantaneous current signal to measure a Network Delivered Power Parameter.

13. A method according to claim 12, further comprising comparing the Delivered Power Parameter, the Harmonic Apparent Power Parameter, the Voltage Distortion Power Parameter, or the Current Distortion Power Parameter with another power parameter determined by the method to produce a dimensionless figure of merit representative of the waveform distortion produced, in the electrical power signal, by a load to which the electrical power signal is supplied.

14. A method according to claim 9, wherein the filtering step comprises:

filtering the instantaneous voltage signal to obtain its fundamental frequency components;

filtering the instantaneous current signal to obtain at least one of its harmonic frequency components; and using the filtered signals to determine a Current Distortion Power Parameter.

15. A method according to claim 9, wherein the filtering step comprises:

filtering the instantaneous voltage signal to obtain at least one of its harmonic frequency components;

filtering the instantaneous current signal to obtain its fundamental frequency components; and using the filtered signals to determine a Voltage Distortion Power Parameter.

16. A method according to claim 9, wherein the filtering step comprises:

filtering the instantaneous voltage signal to obtain at least one of its harmonic frequency components;

filtering the instantaneous current signal to obtain at least one of its harmonic frequency components; and using the filtered signals to determine a Harmonic Apparent Power Parameter.

17. A method according to claim 9, further comprising: providing two or more different types of filtering; and selecting between these different types of filtering to obtain two or more different electrical power parameters.

18. A method according to claim 1, wherein:

the electrical power signal is a multiple-phase signal;

the calculating steps comprise: calculating a single first instantaneous power component for each of the multiple phases; summing the single first instantaneous components together; calculating a single second instantaneous power component for each of the multiple phases; and summing the single second instantaneous components together; and the RMS averaging step comprises: averaging the summed first instantaneous power components and the summed second instantaneous components; and combining them together to provide the first and second averaged instantaneous power components.

19. A method according to claim 18, wherein the electrical power signal comprises an unbalanced multiple-phase signal.

20. A method according to claim 18, wherein the electrical power signal comprises a balanced multiple-phase signal.

21. A method according to claim 18, further comprising resolving the multiple-phase signal into a phase sequence for use in establishing the effect of a load on an electric power network.

22. A method according to claim 21, wherein the phase sequence comprises a positive-phase sequence in order to obtain a measure representative of the power generated at a source of the electrical power signal.

23. A method according to claim 22, wherein the phase sequence comprises negative and zero-phase sequences in order to obtain a measure representative of the power converted in the load and the positive, the negative and the zero-phase sequences are used to obtain a measure representative of the power used by the load.

24. A method according to claim 21, wherein the phase sequence comprises negative and zero-phase sequences in order to obtain a measure representative of the power converted in the load.

25. A method according to claim 21, wherein the resolving step is operatively selectable by a user.

26. A method according to claim 1, further comprising converting the instantaneous current signal of the electrical power signal into a proportional voltage representation signal for use in the calculating and averaging steps.

27. A method according to claim 1, further comprising converting the instantaneous voltage and instantaneous current signals of the electrical power signal into frequency spectra, and wherein the calculating and averaging steps are implemented in the frequency domain with equivalent frequency spectra processing steps.

28. A method according to claim 1, further comprising sampling the instantaneous voltage and instantaneous current signals to obtain a digital representation thereof and using the digital representations in the subsequent processing steps.

29. A method according to claim 1, wherein the electrical power signal comprises a non-sinusoidal waveform signal.

30. A power meter for measuring the value of an electrical power parameter of an electrical power signal, the meter being arranged to implement a method according to claim 1.

31. A method of measuring an electrical power parameter of an electrical power signal, the method comprising:

filtering at least one of an instantaneous voltage signal or an instantaneous current signal of the electrical power signal;

using the filtered instantaneous voltage or current signal in:

calculating first and second instantaneous power components as the respective products of non phase-shifted/ phase-shifted, instantaneous voltage and instantaneous current signals;

RMS averaging each of the first and second instantaneous power components to determine their respective magnitudes; and using the calculated magnitudes determined from the RMS averaging step, to determine the value of the electrical power parameter.

32. A method according to claim 31, wherein the filtering step results in the fundamental frequency component of at least one of the instantaneous voltage or instantaneous current signals being obtained.

33. A method according to claim 31, wherein the filtering step results in at least one of the harmonic frequency components of at least one of the instantaneous voltage or instantaneous current signals being obtained.

34. A method according to claim 31, wherein the filtering step comprises:

filtering the instantaneous voltage signal to obtain its fundamental frequency components; and using the filtered instantaneous voltage signal and the unfiltered instantaneous current signal to measure a Delivered Power Parameter frequency spectrum.

35. A method according to claim 34, further comprising comparing one of the group comprising: the Delivered Power Parameter, the Harmonic Apparent Power Parameter, the Voltage Distortion Power Parameter, and the Current Distortion Power Parameter, with another power parameter determined by the method to produce a dimensionless figure of merit representative of the waveform distortion produced, in the electrical power signal, by a load to which the electrical power signal is supplied.

36. A method according to claim 31, wherein the filtering step comprises:

filtering the instantaneous voltage signal to obtain its fundamental frequency components;

filtering the instantaneous current signal to obtain at least one of its harmonic frequency components; and using the filtered signals to determine a Current Distortion Power Parameter.

37. A method according to claim 31, wherein the filtering step comprises:

filtering the instantaneous voltage signal to obtain at least one of its harmonic frequency components;

filtering the instantaneous current signal to obtain its fundamental frequency components; and using the filtered signals to determine a Voltage Distortion Power Parameter.

38. A method according to claim 31, wherein the filtering step comprises:

filtering the instantaneous voltage signal to obtain at least one of its harmonic frequency components;

filtering the instantaneous current signal to obtain at least one of its harmonic frequency components; and using the filtered signals to determine a Harmonic Apparent Power Parameter.

39. A method according to claim 31, further comprising: providing two or more different types of filtering; and selecting between these different types of filtering to obtain two or more different electrical power parameters.

40. A method of measuring a power quantity of a multiple-phase electrical power signal, the method comprising:

resolving the multiple-phase signal into a phase sequence for use in establishing the effect on the electrical power signal of a load to which the electrical power signal is supplied;

using the phase sequence in:

calculating first and second instantaneous power components as the respective products of non phase-shifted/ phase-shifted, instantaneous voltage and instantaneous current signals; and RMS averaging each of the first and second power components to determine their respective magnitudes; and using the calculated magnitudes determined from the RMS averaging step, to determine the value of the electrical power parameter.

41. A method according to claim 40, wherein the phase sequence comprises a positive phase sequence in order to obtain a measure representative of the power generated at a source of the electrical power signal.

42. A method according to claim 41, wherein the phase sequence comprises negative and zero phase sequences in order to obtain a measure representative of the power generated in the load and the positive, the negative and the zero-phase sequences are used to obtain a measure representative of the power used by the load.

43. A method according to claim 40, wherein the phase sequence comprises negative and zero phase sequences in order to obtain a measure representative of the power generated in the load.

44. A method according to claim 40, wherein the resolving step is operatively selectable by a user.

45. A method according to claim 40, wherein the electrical power signal comprises an unbalanced multiple-phase power signal.

46. An electrical power meter for measuring the value of an electrical power parameter of an electrical power signal, the meter comprising:

means for calculating a first instantaneous power component as the product of an instantaneous voltage signal of the electrical power signal and an instantaneous current signal of the electrical power signal;

means for implementing a relative phase shift between the instantaneous voltage signal and the instantaneous current signal;

means for calculating a second instantaneous power component as the product of the relatively phase-shifted instantaneous voltage and instantaneous current signals;

means for RMS averaging each of the first and second power components to determine their respective magnitudes; and means for using the calculated magnitudes determined by the RMS averaging means to determine the value of the electrical power parameter.

47. A power meter according to claim 46, wherein the phase shifting means shifts the instantaneous voltage signal of the electrical power signal by 90 degrees prior to the calculating means calculating the second instantaneous power component.

48. A power meter according to claim 46, further comprising a step-down voltage means for stepping down the instantaneous voltage signal of the electrical power signal to a level suitable for measurement by the meter.

49. A power meter according to claim 46, further comprising a conversion means for converting the instantaneous current signal of the electrical power signal to a representative voltage.

50. A power meter according to claim 46, the meter being arranged to calculate several different power parameters and further comprising means for selectively displaying information regarding the values of the calculated power parameters.

51. A power meter according to claim 46, further comprising means for sampling the instantaneous voltage and instantaneous current signals to obtain a digital representation thereof and means for using the digital representations in the subsequent processing steps.

* * * * *